US009704796B1

(12) United States Patent
Gu et al.

(10) Patent No.: US 9,704,796 B1
(45) Date of Patent: Jul. 11, 2017

(54) INTEGRATED DEVICE COMPRISING A CAPACITOR THAT INCLUDES MULTIPLE PINS AND AT LEAST ONE PIN THAT TRAVERSES A PLATE OF THE CAPACITOR

(71) Applicant: QUALCOMM Incorporated, San Diego, CA (US)

(72) Inventors: Shiqun Gu, San Diego, CA (US); Shree Krishna Pandey, San Diego, CA (US); Ratibor Radojcic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/041,853

(22) Filed: Feb. 11, 2016

(51) Int. Cl.
*H01L 23/498* (2006.01)
*H01L 23/31* (2006.01)
*H01L 21/48* (2006.01)
*H01L 23/00* (2006.01)

(52) U.S. Cl.
CPC .... *H01L 23/49838* (2013.01); *H01L 21/4846* (2013.01); *H01L 23/3128* (2013.01); *H01L 24/17* (2013.01); *H01L 2224/16268* (2013.01); *H01L 2924/05042* (2013.01); *H01L 2924/19011* (2013.01); *H01L 2924/19041* (2013.01); *H01L 2924/19102* (2013.01)

(58) Field of Classification Search
CPC .......... H01L 23/49838; H01L 21/4846; H01L 23/3128; H01L 24/17; H01L 2224/16268; H01L 2924/19011; H01L 2924/19041; H01L 2924/19102; H01L 2924/05042

USPC ................................................. 257/532, 773
See application file for complete search history.

(56) References Cited

U.S. PATENT DOCUMENTS

| 8,062,968 | B1 | 11/2011 | Conn |
| 8,411,450 | B2 | 4/2013 | Yamazaki et al. |
| 2003/0124767 | A1 | 7/2003 | Lee et al. |
| 2007/0132088 | A1 | 6/2007 | Kariya et al. |
| 2009/0236686 | A1 | 9/2009 | Shim et al. |
| 2010/0224960 | A1 | 9/2010 | Fischer |
| 2014/0252548 | A1 | 9/2014 | Yen et al. |
| 2014/0374877 | A1 | 12/2014 | Oh et al. |

(Continued)

OTHER PUBLICATIONS

International Search Report and Written Opinion—PCT/US2017/017059—ISA/EPO—May 11, 2017.

*Primary Examiner* — Caleen Sullivan
(74) *Attorney, Agent, or Firm* — Loza & Loza, LLP/Qualcomm

(57) ABSTRACT

Some features pertain to an integrated device that includes a die and a first redistribution portion coupled to the die. The first redistribution portion includes at least one dielectric layer and a capacitor. The capacitor includes a first plate, a second plate, and an insulation layer located between the first plate and the second plate. The first redistribution portion further includes several first pins coupled to the first plate of the capacitor. The first redistribution portion further includes several second pins coupled to the second plate of the capacitor. In some implementations, the capacitor includes the first pins and/or the second pins. In some implementations, at least one pin from the several first pins traverses through the second plate to couple to the first plate of the capacitor. In some implementations, the second plate comprises a fin design.

22 Claims, 20 Drawing Sheets

PROFILE VIEW

(56) References Cited

U.S. PATENT DOCUMENTS

| 2015/0011051 A1 | 1/2015 | Lin et al. | |
|---|---|---|---|
| 2015/0123242 A1* | 5/2015 | Jen | H01L 28/60 |
| | | | 257/532 |
| 2015/0221714 A1* | 8/2015 | Gu | H01L 23/5223 |
| | | | 257/532 |

* cited by examiner

US 9,704,796 B1

INTEGRATED DEVICE COMPRISING A CAPACITOR THAT INCLUDES MULTIPLE PINS AND AT LEAST ONE PIN THAT TRAVERSES A PLATE OF THE CAPACITOR

BACKGROUND

Field

Various features relate to an integrated device that includes a capacitor, and more specifically to a capacitor that includes multiple pins and at least one pin that traverses a plate of the capacitor.

Background

FIG. 1 illustrates a configuration of an integrated device that includes a die. Specifically, FIG. 1 illustrates an integrated device 100 that includes a first die 102 and a package substrate 106. The package substrate 106 includes a dielectric layer and a plurality of interconnects 110. The package substrate 106 is a laminated substrate. The plurality of interconnects 110 includes traces, pads and/or vias. The first die 102 is coupled to the package substrate 106 through a first plurality of solder balls 112. The package substrate 106 is coupled to a printed circuit board (PCB) 108 through a second plurality of solder balls 116. FIG. 1 illustrates that a capacitor 120 is mounted on the PCB 108. The capacitor 120 is located externally of the integrated device 100, and takes up a lot real estate on the PCB 108.

A drawback of the capacitor 120 shown in FIG. 1 is that it creates a device with a form factor that may be too large for the needs of mobile computing devices and/or wearable computing devices. This may result in a device that is either too large and/or too thick. That is, the combination of the integrated device 100, the capacitor 120 and the PCB 108 shown in FIG. 1 may be too thick and/or have a surface area that is too large to meet the needs and/or requirements of mobile computing devices and/or wearable computing devices.

Therefore, there is a need for an integrated device that includes a compact form factor, while at the same time meeting the needs and/or requirements of mobile devices, Internet of Things (IoT) devices, computing devices and/or wearable computing devices.

SUMMARY

Various features relate to a capacitor, and more specifically to a capacitor that includes multiple pins and at least one pin that traverses a plate of the capacitor.

An example provides an integrated device that includes a die and a first redistribution portion coupled to the die. The first redistribution portion includes at least one dielectric layer and a capacitor. The capacitor includes a first plate, a second plate, and an insulation layer located between the first plate and the second plate. The first redistribution portion further includes several first pins coupled to the first plate of the capacitor. The first redistribution portion further includes several second pins coupled to the second plate of the capacitor.

Another example provides an apparatus that includes a die and a first redistribution portion coupled to the die. The first redistribution portion includes at least one dielectric layer, a means for capacitance located in the at least one dielectric layer, a plurality of first pins coupled to a first portion of the means for capacitance, and a plurality of second pins coupled to a second portion of the means for capacitance.

Another example provides a method for fabricating an integrated device. The method provides a die. The method couples a first redistribution portion to the die. The coupling of the first redistribution portion includes forming at least one dielectric layer. The coupling of the first redistribution portion includes forming a capacitor in the at least one dielectric layer. The forming of the capacitor includes forming a first plate, forming a second plate, and forming an insulation layer between the first plate and the second plate. The coupling of the first redistribution portion includes forming a plurality of first pins over the first plate of the capacitor, and forming a plurality of second pins over the second plate of the capacitor.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain to an integrated device that includes a die and a first redistribution portion coupled to the die. The first redistribution portion includes at least one dielectric layer and a capacitor. The capacitor includes a first plate, a second plate, and an insulation layer located between the first plate and the second plate. The first redistribution portion further includes several first pins coupled to the first plate of the capacitor. The first redistribution portion further includes several second pins coupled to the second plate of the capacitor. In some implementations, the capacitor includes the first pins and/or the second pins. In some implementations, at least one pin from the several first pins traverses through the second plate to couple to the first plate of the capacitor. In some implementations, at least one pin from the several first pins comprises at least one interconnect. In some implementations, the second plate comprises a fin design. In some implementations, the insulation layer substantially forms over a contour of the fin design of the second plate. In some implementations, the insulator includes a k value of at least 20.

Exemplary Capacitor Comprising Multiple Pins

Figure 1:
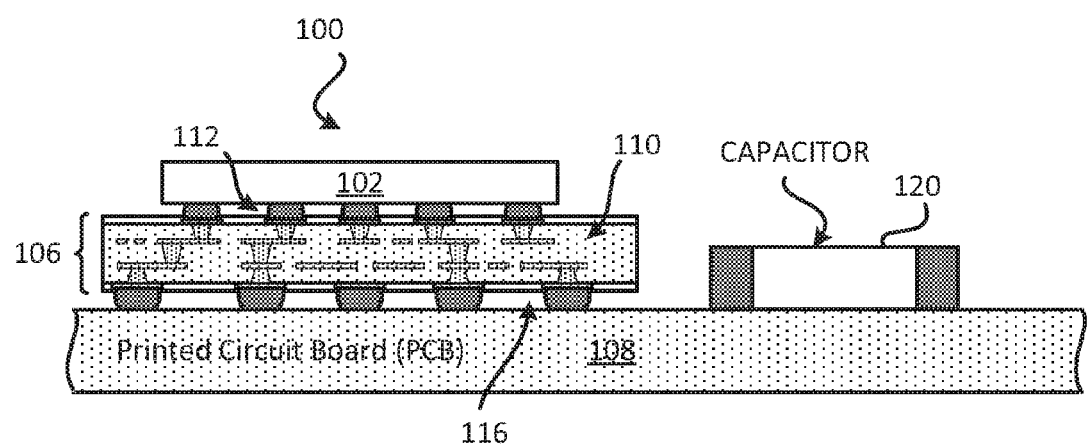
FIG. 1 illustrates an integrated device and a capacitor coupled to a printed circuit board (PCB).
Figure 2:
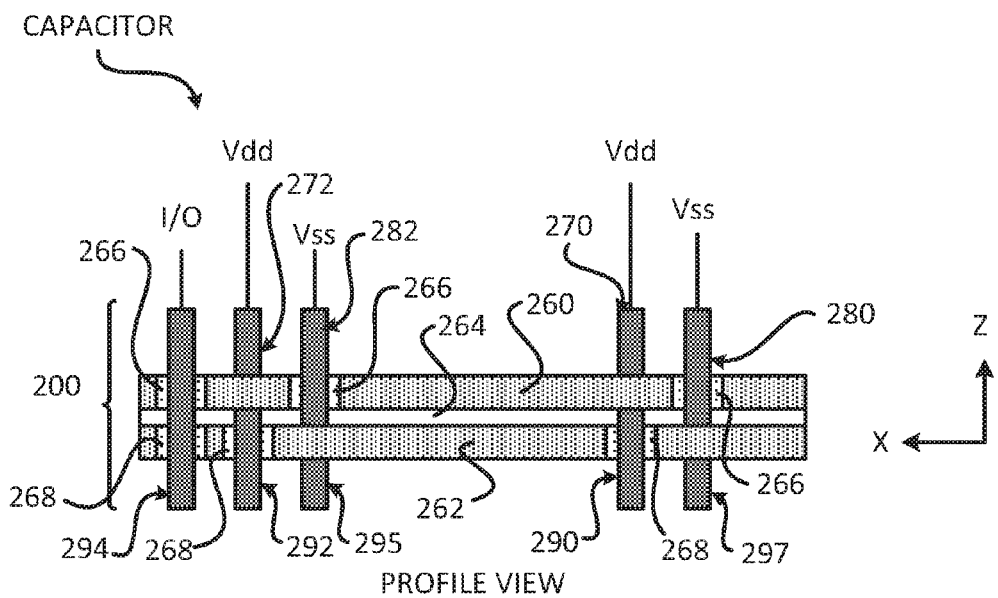
FIG. 2 illustrates a profile view of an example of a capacitor that includes multiple pins and at least one pin that traverses a plate.

FIG. 2 illustrates an example of a capacitor 200 that includes multiple pins. As shown in FIG. 2, the capacitor 200 includes a first plate 260, a second plate 262, and an insulation layer 264. In some implementations, the capacitor 200 is a metal insulator metal (MIM) capacitor. The capacitor 200 may be a means for capacitance. The capacitor 200 may be implemented in different devices. As will be further described below, the capacitor 200 may be implemented in a redistribution portion (e.g., fan out (FO) portion) of an integrated device (e.g., integrated device package) and/or a package substrate.

The insulation layer 264 is located between the first plate 260 (e.g., top plate) and the second plate 262 (e.g., bottom plate). The first plate 260 may include a first electrically conductive plate (e.g., first metal plate). The second plate 262 may include a second electrically conductive plate (e.g., second metal plate). FIG. 2 illustrates that the first plate 260 and the second plate 262 are substantially flat. However, in some implementations, the first plate 260 and/or the second plate 262 may include a U or V shape.

In some implementations, the insulation layer 264 includes a material that has a k value of at least 7 (e.g., Silicon Nitride (SiN), which has K~7). However, different implementations may use a material with a different k value. For example, in some implementations, the insulation layer 264 includes a material that has a k value of at least 20. In some implementation, the insulation layer 264 has a thickness of about 50 nanometers (nm) or less.

FIG. 2 illustrates that a pin 270 (e.g., first pin) and a pin 272 (e.g., first pin) are coupled to the first plate 260 (e.g., coupled to a first surface of the first plate 260). A pin 290 and a pin 292 are coupled to the first plate (e.g., coupled a second surface of the first plate 260). The pin 290 and the pin 292 traverse through the second plate 262 to couple to the first plate 260.

FIG. 2 also illustrates that a pin 280 (e.g., second pin) and a pin 282 are coupled to the second plate 262 (e.g., coupled to a first surface of the second plate 262). The pin 280 and the pin 282 traverse through the first plate 260 and the insulation layer 264, to couple to the second plate 262. A dielectric layer 266 is located between the pin 280 and the first plate 260 so that pin 280 is not directly touching the first plate 260. Similarly, a dielectric layer 266 is located between the pin 282 and the first plate 260 so that pin 282 is not directly touching the first plate 260.

In addition, a dielectric layer 268 is located between the pin 290 and the second plate 262 so that the pin 290 is not directly touching the second plate 262. Similarly, a dielectric layer 268 is located between the pin 292 and the second plate 262 so that the pin 292 is not directly touching the second plate 262.

In some implementations, the pin 270, the pin 272, the pin 290, and the pin 292 are configured to provide one or more electrical paths for a power signal (e.g., $V_{dd}$). In some implementations, the pins 270 and 272 are configured to provide distributed power supply to a chip (e.g., die 404), and the pins 290 and 292 are configured to reduce an IR drop (voltage drop) from a power source to the capacity. In some implementations, the pin 280 and the pin 282 are configured to provide one or more electrical paths for a ground reference signal (e.g., $V_{ss}$). Different implementations may configure the pins to provide different electrical paths for different signals.

FIG. 2 further illustrates a pin 294 that traverses through the first plate 260, the insulation layer 264 and the second plate 262. In some implementations, the pin 294 is an input/output (I/O) pin configured to provide an electrical path for an input/output signal. The pin 294 is not in direct contact with the first plate 260 and the second plate 262 of the capacitor 200. The dielectric layer 266 is located between the pin 294 and the first plate 260 so that the pin 294 is not directly touching the first plate 260. Similarly, the dielectric layer 268 is located between the pin 294 and the second plate 262 so that the pin 294 is not directly touching the second plate 262.

One or more pins may include one or more interconnects. An interconnect may include a trace, a via, and/or a pad. In some implementations, an interconnect is an element or component of a device or package that allows or facilitates an electrical connection and/or electrical path between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Figure 3:
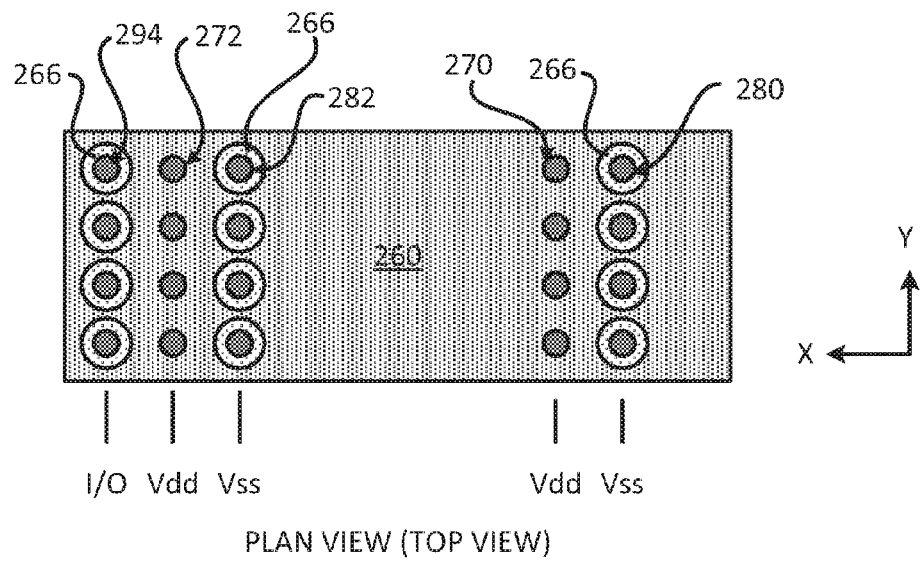
FIG. 3 illustrates a plan view of an example of a capacitor that includes multiple pins and at least one pin that traverses a plate.

FIG. 3 illustrates a plan view (e.g., top view) of the capacitor 200. As shown in FIG. 3, several pins are coupled to the capacitor 200 or traverse through the capacitor 200. The pins are arranged in a row and/or column. FIG. 3 illustrates that several pins 270, several pins 272, several pins 280 and several pins 282 may be coupled to the capacitor 200. FIG. 3 also illustrates that several pins 294 may traverse through the capacitor 200.

The above design of the capacitor 200 provides a capacitor that is compact and that minimizes blocking of interconnects by allowing interconnects for input/output (I/O) signals to traverse through the capacitor 200. In some implementations, one or more input/output (I/O) interconnects or I/O pins may traverse through one or both plates of the capacitor 200.

In some implementations, the capacitor (e.g., capacitor 200, capacitor 400) may include a size of about 2000×2000 microns (μm) or less (e.g., about 100×100 microns (μm)). In some implementations, the pitch (e.g., center to center distance) of two neighboring pins (e.g., power pins, input/output (I/O) pins) may be about 300 microns (μm) or less (e.g., about 20-300 microns (μm)). The above dimensions may apply to other capacitors described in the present disclosure.

In some implementations, the capacitor 200 may include a fin design. An example of capacitor that includes a fin design is further illustrated and described below in at least FIG. 12.

Exemplary Integrated Device Comprising a Capacitor that Includes Multiple Pins

Figure 4:
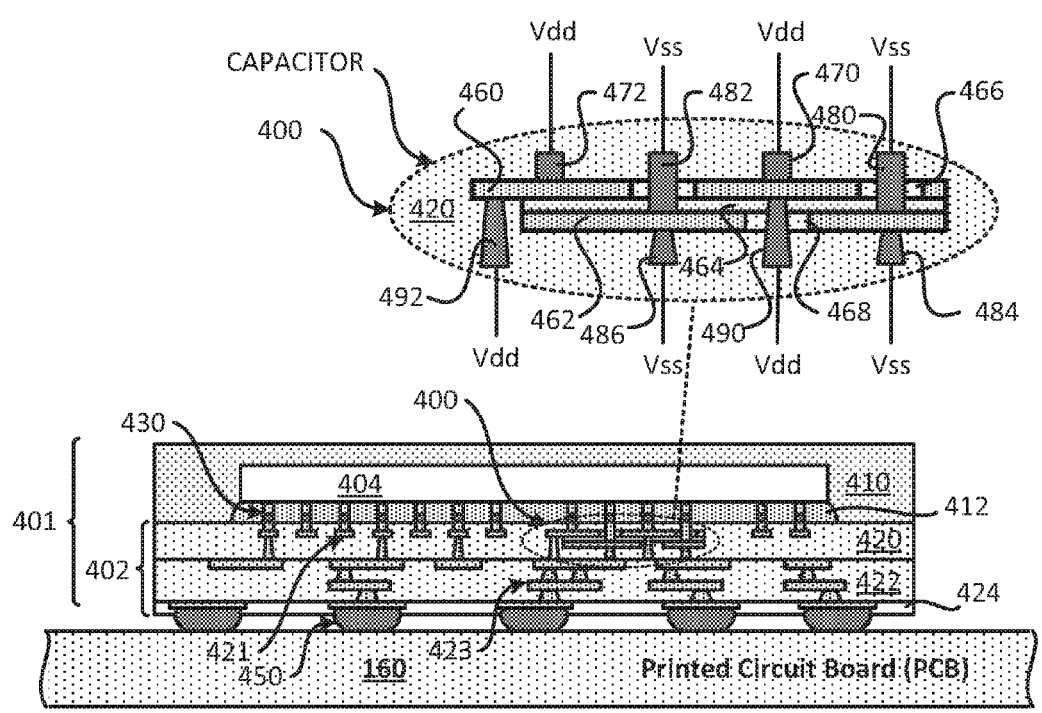
FIG. 4 illustrates a profile view of an integrated device that includes a capacitor that includes multiple pins and at least one pin that traverses a plate.

FIG. 4 illustrates an integrated device 401 that includes a capacitor 400 that includes multiple pins. The integrated device 401 (e.g., integrated device package) includes a redistribution portion 402, a die 404, an encapsulation layer 410, an underfill 412, a plurality of interconnects 430.

The redistribution portion 402 includes at least one first dielectric layer 420, at least one second dielectric layer 422, and a solder resist layer 424. The capacitor 400 is located at least partially in the at least one first dielectric layer 420.

The redistribution portion 402 includes a plurality of first interconnects 421 in the at least one first dielectric layer 420. The redistribution portion also includes a plurality of second interconnects 423 in the at least one second dielectric layer 422. In some implementations, the plurality of first interconnects 421 includes finer pitch and finer spacing than the plurality of second interconnects 423. That is, in some implementations, the plurality of first interconnects 421 includes a first pitch that is less than a second pitch of the plurality of second interconnects 423. In some implementations, the plurality of first interconnects 421 includes a first spacing that is less than a second spacing of the plurality of second interconnects 423.

The die 404 is coupled to the redistribution portion 402 through the plurality of interconnects 430. The plurality of interconnects 430 may include bumps and/or solder interconnects (e.g., solder balls). The underfill 412 is located between the die 404 and the redistribution portion 402. The underfill 412 may at least partially surround the plurality of interconnects 430. The encapsulation layer 410 at least partially encapsulates the die 404. The encapsulation layer 410 may include a mold, an epoxy and/or a resin material.

As shown in FIG. 4, the capacitor 400 includes a first plate 460 (e.g., top plate), a second plate 462 (e.g., bottom plate), and an insulation layer 464. In some implementations, the capacitor 400 is a metal insulator metal (MIM) capacitor. The capacitor 400 may be a means for capacitance.

FIG. 4 illustrates that a pin 470 (e.g., first pin) and a pin 472 (e.g., first pin) are coupled to the first plate 460 (e.g., coupled to a first surface of the first plate 460). A pin 490 and a pin 492 are coupled to the first plate (e.g., coupled a second surface of the first plate 460). The pin 490 traverses through the second plate 462 to couple to the first plate 460.

FIG. 4 also illustrates that a pin 480 (e.g., second pin) and a pin 482 are coupled to the second plate 462 (e.g., coupled to a first surface of the second plate 462. The pin 480 and the pin 482 traverse through the first plate 460 and the insulation layer 464, to couple to the second plate 462. A pin 484 and a pin 486 are coupled to the second plate (e.g., coupled to a second surface of the second plate 462). A dielectric layer 466 is located between the pin 480 and the first plate 460 so that pin 480 is not directly touching the first plate 460.

Similarly, a dielectric layer 468 is located between the pin 490 and the second plate 462 so that the pin 490 is not directly touching the second plate 462. In some implementations, the dielectric layer 466 and the dielectric layer 468 are part of the dielectric layer 420. In some implementations, the dielectric layer 466, the dielectric layer 468, and the dielectric layer 420 are all the same dielectric layer.

In some implementations, the pin 470, the pin 472, the pin 490, and the pin 492 are configured to provide one or more electrical paths for a power signal (e.g., $V_{dd}$). In some implementations, the pin 480, the pin 482, the pin 484, and the pin 486 are configured to provide one or more electrical paths for a ground reference signal (e.g., $V_{ss}$). Different implementations may configure the pins to provide different electrical paths for different signals.

In some implementations, at least one pin may traverse through one or both the first plate 460 and the second plate 462. The pin may be an input/output (I/O) pin as described above for the pin 294 of FIG. 2.

In some implementations, several pins (e.g., pins 470, 472, 480, 482, 484, 486, 490, 492) may be coupled to the capacitor 400 or traverse through the capacitor 400, as described in FIG. 3. For example, there may be several pins 470, 472, 480, 482, 484, 486, 490, and/or 492. The pins may be arranged in rows and/or columns as described in FIG. 3. Although, not shown in FIG. 4, one or more pins may traverse both the first plate 460 and the second plate 462, in a manner similar to the pin 294 of FIG. 2.

A pin coupled to a capacitor (e.g., coupled to a plate of a capacitor) is configured to provide an electrical path to and from a capacitor. There are several advantages to providing a pin that traverses through one or both plates (e.g., first plate 460, second plate 462). One, an electrical path through one or more plates is a more direct path to and from a die, which means a shorter path to and from the die. Two, an electrical path through one or more plates means that the electrical path does not need to be routed around the capacitor, saving space and real estate in the substrate, which can result in an overall smaller form factor for the integrated device. Three, a more direct path for the power signal and/or ground reference signal means that less material is used, thereby reducing the cost of fabricating the integrated device. Four, a direct and shorter electrical path means less current drop between the die and the capacitor, which means better signal performance. In some implementations, providing and coupling several pins to a capacitor provides lower inductance to and from the capacitor. In some implementations, providing and coupling several pins is possible due to the fabrication processes described in the present disclosure.

In some implementations, the capacitor 400 may include a fin design. An example of a capacitor that includes a fin design is further illustrated and described below in at least FIG. 12.

Figure 5:
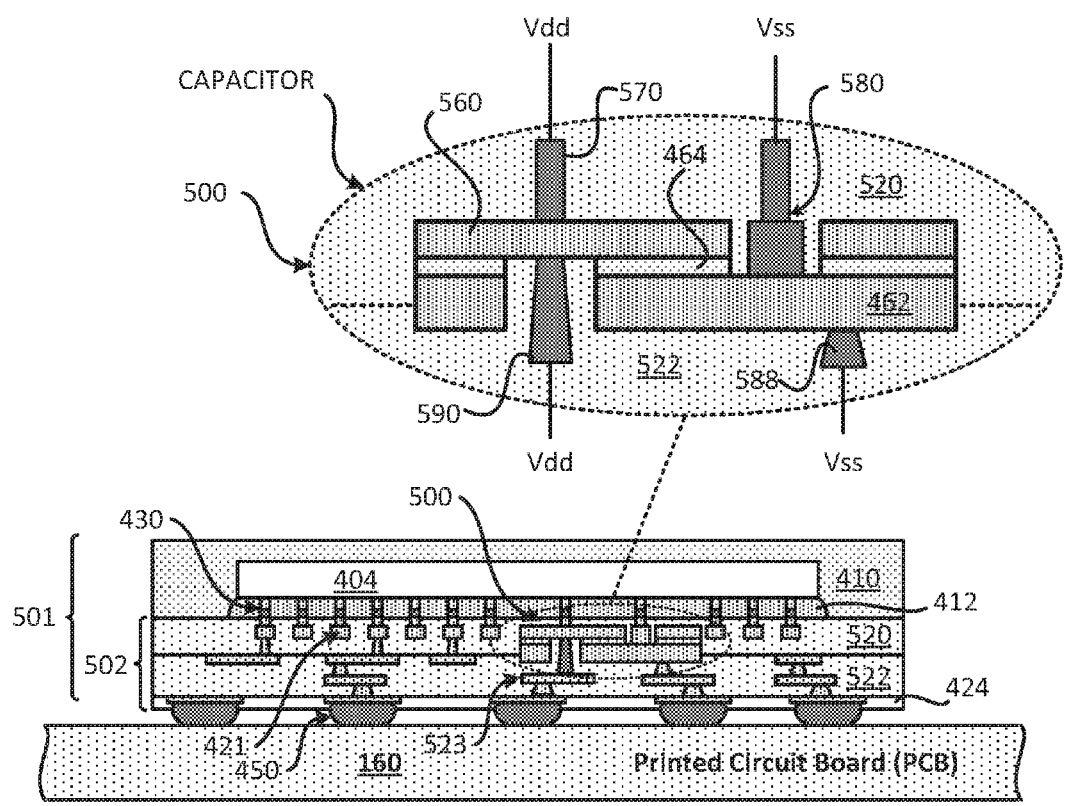
FIG. 5 illustrates a profile view of an integrated device that includes a capacitor that includes multiple pins and at least one pin that traverses a plate.

FIG. 5 illustrates another example of an integrated device 501 that includes a capacitor 500. The capacitor 500 may be a means for capacitance. The integrated device 501 (e.g., integrated device package) is similar to the integrated device 401 of FIG. 4, except that the integrated device 501 includes a capacitor (e.g., capacitor 500) with a different design.

The integrated device 501 includes a redistribution portion 502 coupled to the die 404. The redistribution portion 502 includes the capacitor 500, the at least one first dielectric layer 520 and the at least one second dielectric layer 522.

As shown in FIG. 5, the capacitor 500 is at least partially located in the at least one first dielectric layer 520 and the at least one second dielectric layer 522. The capacitor 500 includes a first plate 560 (e.g., top plate), a second plate 562 (e.g., bottom plate), and an insulation layer 564. The insulation layer 564 is located between the first plate 560 and the second plate 562.

A pin 570 is coupled to the first plate 560, and a pin 590 is coupled to the first plate 560. A pin 580 is coupled to the second plate 562, and a pin 588 is coupled to the second plate 562. A pin may include one or more interconnects (e.g., via, pad, trace). The pin 580 traverses through the first plate 560 to couple to the second plate 562. In FIG. 5, the pin 580 includes two interconnects. However, the pin 580 may include different numbers of interconnects. The pin 590 traverses through the second plate 562 to couple to the first plate 560. The dielectric layer 520 may separate the pin 580 and the first plate 560. Similarly, the dielectric layer 522 may separate the pin 590 and the second plate 562.

In some implementations, the pin 570 and the pin 590 are configured to provide one or more electrical paths for a power signal (e.g., $V_{dd}$). In some implementations, the pin 580 and the pin 588 are configured to provide one or more electrical paths for a ground reference signal (e.g., $V_{ss}$). Different implementations may configure the pins to provide different electrical paths for different signals.

In some implementations, several pins (e.g., pins 570, 580, 588, 590) may be coupled to the capacitor 500 or traverse through the capacitor 500, as described in FIG. 3. Although, not shown in FIG. 5, one or more pins may traverse both the first plate 560 and the second plate 562, in a manner similar to the pin 294 of FIG. 2.

In some implementations, the capacitor 500 may include a fin design. An example of a capacitor that includes fin design is further illustrated and described below in at least FIG. 12.

Figure 6:
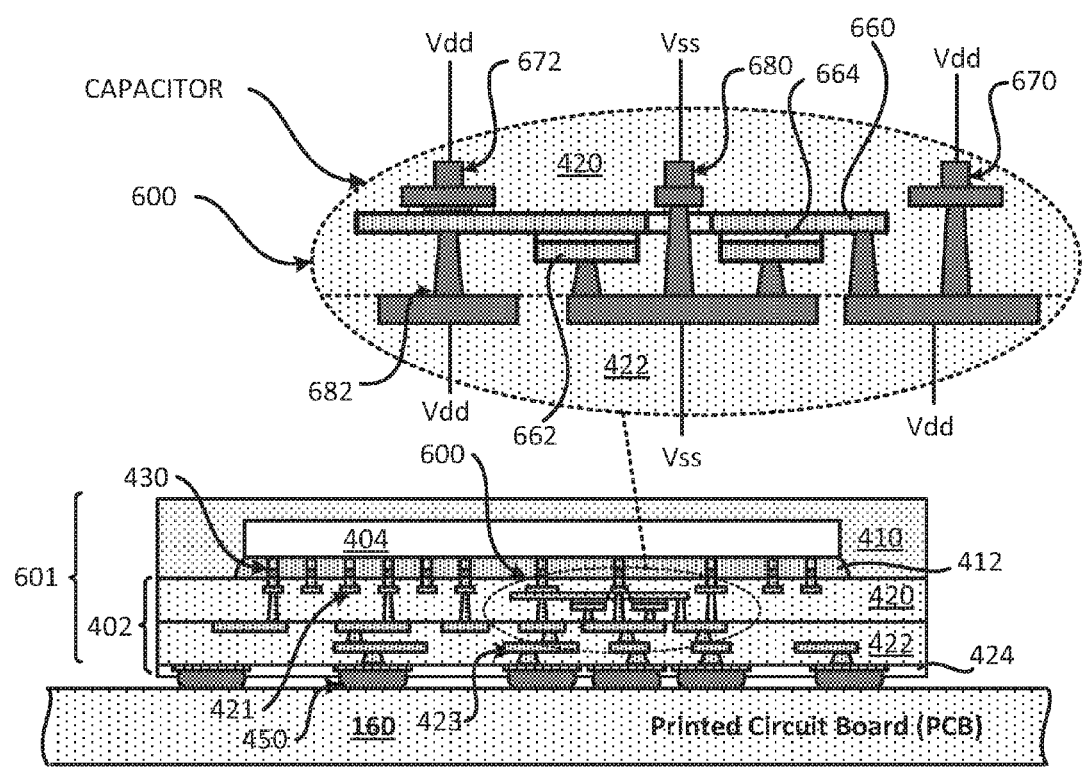
FIG. 6 illustrates a profile view of an integrated device that includes a capacitor that includes multiple pins and at least one pin that traverses a plate.

FIG. 6 illustrates another example of an integrated device 601 that includes a capacitor 600. The capacitor 600 may be a means for capacitance. The integrated device 601 (e.g., integrated device package) is similar to the integrated device 401 of FIG. 4, except that the integrated device 601 includes a capacitor (e.g., capacitor 600) with a different design.

As shown in FIG. 6, the capacitor 600 is located in the redistribution portion 402. In particular, the capacitor 600 is at least partially located in the at least one first dielectric layer 620 and the at least one second dielectric layer 622. The capacitor 600 includes a first plate 660 (e.g., top plate), a second plate 662 (e.g., bottom plate), and an insulation layer 664. The insulation layer 664 is located between the first plate 660 and the second plate 662.

The pin 670, the pin 672 and the pin 682 are coupled to the first plate 660. The pin 680 is coupled to the second plate 662. As shown in FIG. 6, the pin 670, the pin 672, the pin 682, and the pin 680 may each include one or more interconnects (e.g., trace, pad, via).

In some implementations, the pin 670, the pin 672 and 682 are configured to provide one or more electrical paths for a power signal (e.g., $V_{dd}$). In some implementations, the pin 680 is configured to provide one or more electrical paths for a ground reference signal (e.g., $V_{ss}$). Different implementations may configure the pins to provide different electrical paths for different signals.

In some implementations, several pins (e.g., pins 670, 672, 680, 682) may be coupled to the capacitor 600 or traverse through the capacitor 600, as described in FIG. 3. Although, not shown in FIG. 6, one or more pins may traverse both the first plate 660 and the second plate 662, in a manner similar to the pin 294 of FIG. 2.

Figure 7:
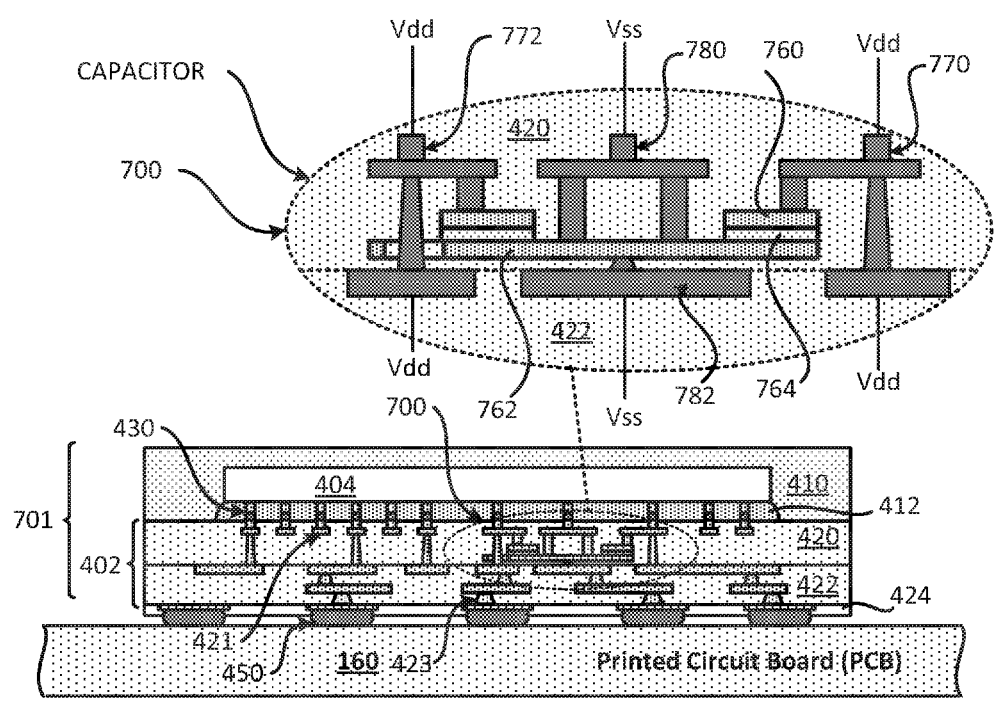
FIG. 7 illustrates a profile view of an integrated device that includes a capacitor that includes multiple pins and at least one pin that traverses a plate.

FIG. 7 illustrates another example of an integrated device 701 that includes a capacitor 700. The capacitor 700 may be a means for capacitance. The integrated device 701 (e.g., integrated device package) is similar to the integrated device 601 of FIG. 6, except that the integrated device 701 includes a capacitor (e.g., capacitor 700) with a different design.

In some implementations, the capacitor 700 may include a fin design. An example of a fin design is further illustrated and described below in at least FIG. 12.

As shown in FIG. 7, the capacitor 700 is located in the redistribution portion 402. In particular, the capacitor 702 is at least partially located in the at least one first dielectric layer 720 and the at least one second dielectric layer 722. The capacitor 700 includes a first plate 760 (e.g., top plate), a second plate 762 (e.g., bottom plate), and an insulation layer 764. The insulation layer 764 is located between the first plate 760 and the second plate 762.

A pin may include one or more interconnects (e.g., trace, pad, via). The pin 770 and the pin 772 may each include several interconnects. The pin 770 and the pin 772 are coupled to the first plate 760. FIG. 7 also illustrates that an interconnect of the pin 772 traverses through the second plate 762. The pin 780 and the pin 782 are coupled to the second plate 762. The pin 780 and the pin 782 may each include several interconnects.

In some implementations, the pin 770 and the pin 772 are configured to provide one or more electrical paths for a power signal (e.g., $V_{dd}$). In some implementations, the pin 780 and the pin 782 are configured to provide one or more electrical paths for a ground reference signal (e.g., $V_{ss}$). Different implementations may configure the pins to provide different electrical paths for different signals.

In some implementations, several pins (e.g., pins 770, 772, 780, 782) may be coupled to the capacitor 700 or traverse through the capacitor 700, as described in FIG. 3. Although, not shown in FIG. 7, one or more pins may traverse both the first plate 760 and the second plate 762, in a manner similar to the pin 294 of FIG. 2.

In some implementations, the capacitor 700 may include a fin design. An example of a capacitor that includes a fin design is further illustrated and described below in at least FIG. 12.

In some implementations, one or more input/output (I/O) interconnects or I/O pins may traverse through one or both plates of the above capacitors (e.g., capacitors 400, 500, 600, 700), as described above in FIGS. 2 and 3 (see e.g., pin 294). In such instances, an input/output (I/O) pin or an input/output (I/O) interconnects that traverses one or both plates of a capacitor may include one or more interconnects (e.g., trace, via, pad).

Exemplary Sequence for Fabricating an Integrated Device Comprising a Capacitor

In some implementations, providing/fabricating an integrated device that includes a capacitor with multiple pins includes several processes. FIG. 8 (which includes FIGS. 8A-8D) illustrates an exemplary sequence for providing/fabricating an integrated device (e.g., integrated device package) that includes a capacitor with multiple pins. In some implementations, the sequence of FIGS. 8A-8D may be used to fabricate the integrated device that includes a capacitor with multiple pins of FIGS. 4-7 and/or other integrated devices described in the present disclosure. FIGS. 8A-8D will be described in the context of providing/fabricating the integrated device of FIG. 4. In particular, FIGS. 8A-8D will be described in the context of fabricating the integrated device 401 of FIG. 4.

It should be noted that the sequence of FIGS. 8A-8D may combine one or more stages in order to simplify and/or clarify the sequence for providing an integrated device. In some implementations, the order of the processes may be changed or modified.

Figure 8A:
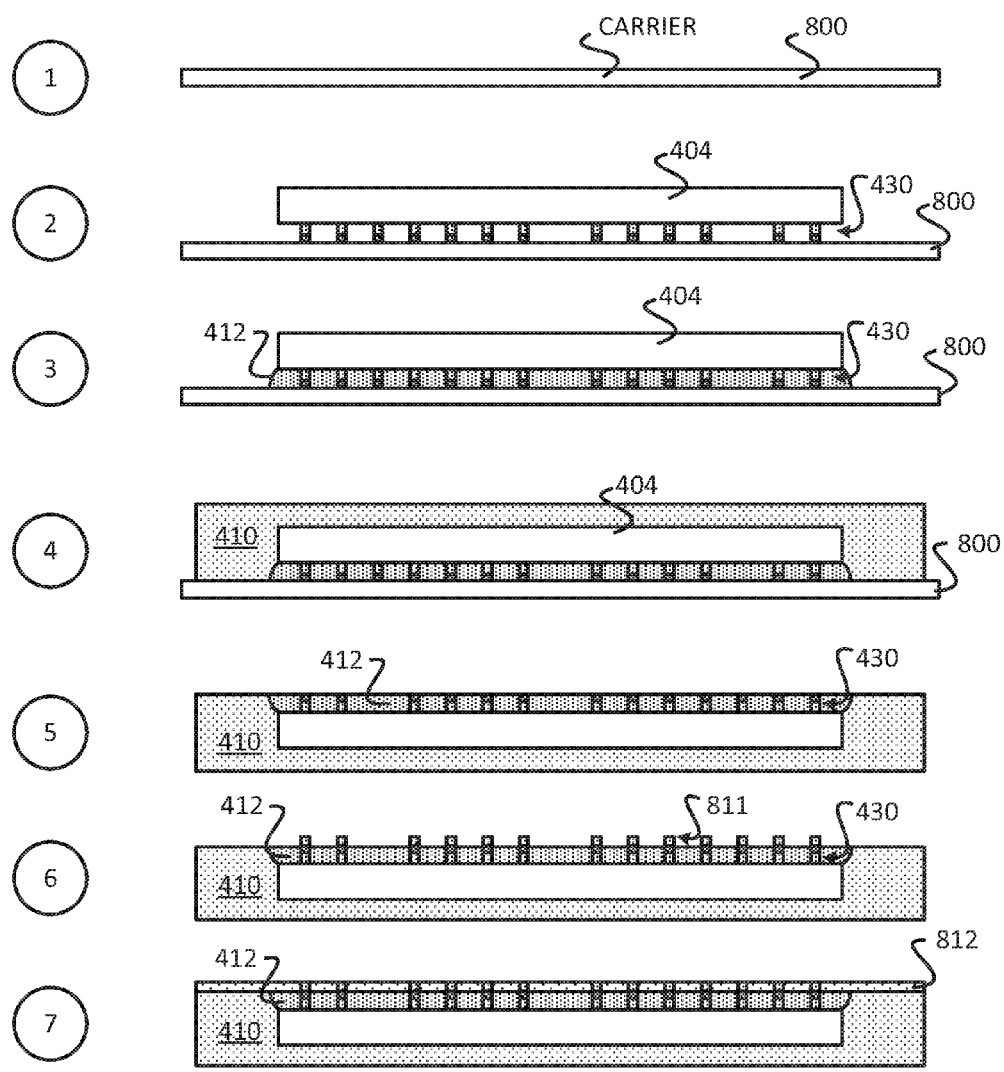
FIGS. 8A-8D illustrate an example of a sequence for fabricating an integrated device that includes a capacitor that includes multiple pins and at least one pin that traverses a plate of the capacitor.

Stage 1 of FIG. 8A, illustrates a carrier 800 being provided. The carrier 800 may be used as temporary base to fabricate an integrated device.

Stage 2 illustrates a die 404 coupled to the carrier 800, through a plurality of interconnects 430. The plurality of interconnects 430 may include pillars and solder interconnects (e.g., solder ball).

Stage 3 illustrates an underfill 412 being provided between the die 404 and the carrier 800. The underfill 412 may at least partially surround the plurality of interconnects 430.

Stage 4 illustrates an encapsulation layer 410 that is formed over the die 404 and the carrier 800. The encapsulation layer 410 may at least partially encapsulate the die 404 and the underfill 412.

Stage 5 illustrates a state after the carrier 800 has been decoupled (e.g., removed, grinded) from the encapsulation layer 410, the underfill 412, and the plurality of interconnect 430. In some implementations, decoupling the carrier 800 may also remove portions of the encapsulation layer 410, the underfill 412, and/or the plurality of interconnects 430. For example, solder interconnects and/or the pillars of the plurality of interconnects 430 may be removed during the decoupling of the carrier 800.

Stage 6 illustrates a plurality of interconnects 811 formed on the plurality of interconnects 430. In some implementations, a plating process may be used to form one or more metal layers (e.g., seed layer, metal layer) on the plurality of interconnects 430.

Stage 7 illustrates a dielectric layer 812 formed over the encapsulation layer 410 and the underfill 412. Different implementations may use different material for the dielectric layer 812.

Figure 8B:
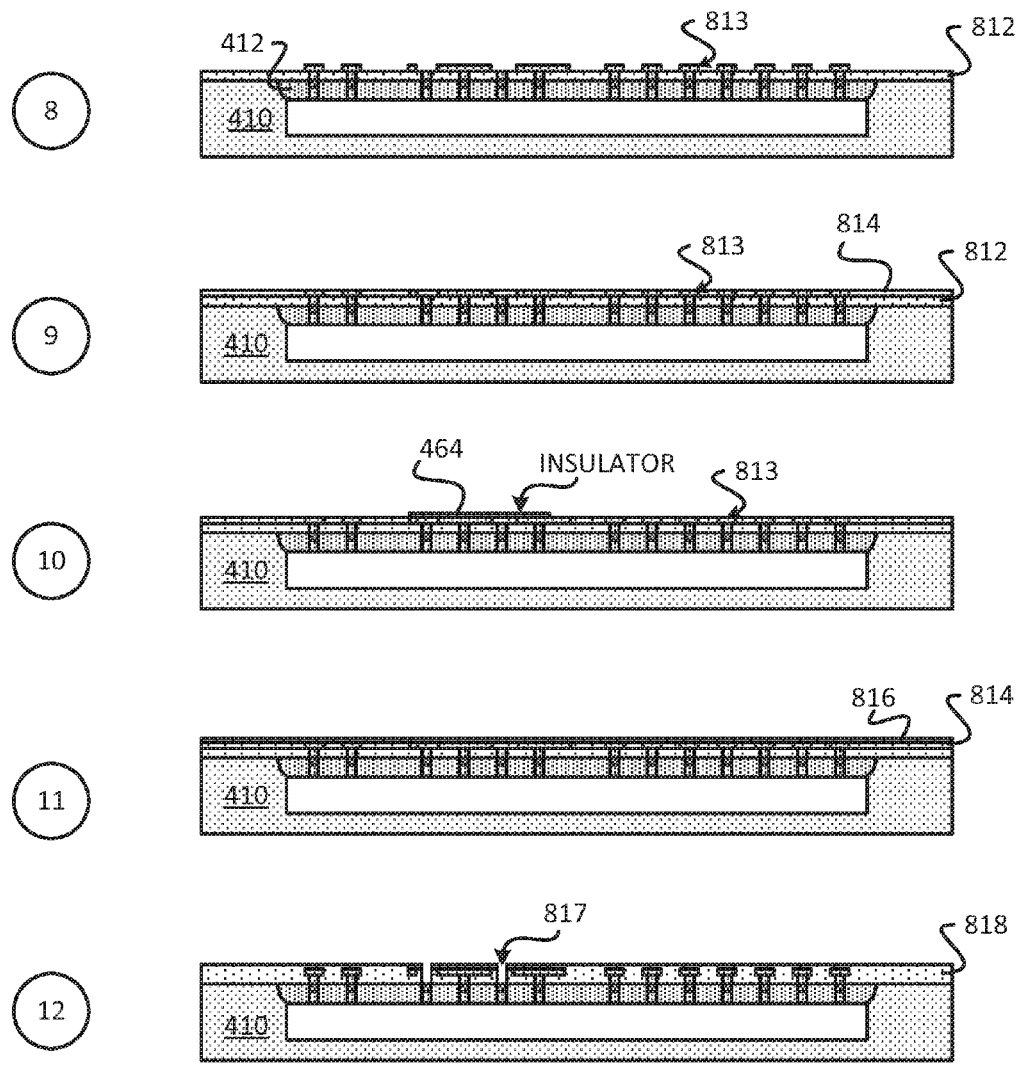

Stage 8 of FIG. 8B, illustrates a plurality of interconnects 813 formed on the plurality of interconnects 811 and the dielectric layer 812. In some implementations, a plating process may be used to form one or more metal layers (e.g., seed layer, metal layer) on the plurality of interconnects 811 and the dielectric layer 812.

Stage 9 illustrates a dielectric layer 814 formed over the dielectric layer 812. Different implementations may use different material for the dielectric layer 814.

Stage 10 illustrates an insulation layer 464 formed over some of the plurality of interconnects 813. In some implementations, the insulation layer 464 includes a material that has a k value of at least 7. However, different implementations may use a material with a different k value. In some implementation, the insulation layer 464 has a thickness of about 50 nanometers (nm) or less.

Stage 11 illustrates a dielectric layer 816 formed over the dielectric layer 814. Different implementations may use different material for the dielectric layer 816.

Stage 12 illustrates a plurality of cavities 817 formed through the plurality of in interconnects 813, the insulation layer 464, the dielectric layer 812, the dielectric layer 814 and/or the dielectric layer 816. Different implementations may use different processes for forming the plurality of cavities 817. In some implementations, a laser process may be used to form the plurality of cavities 817.

Figure 8C:
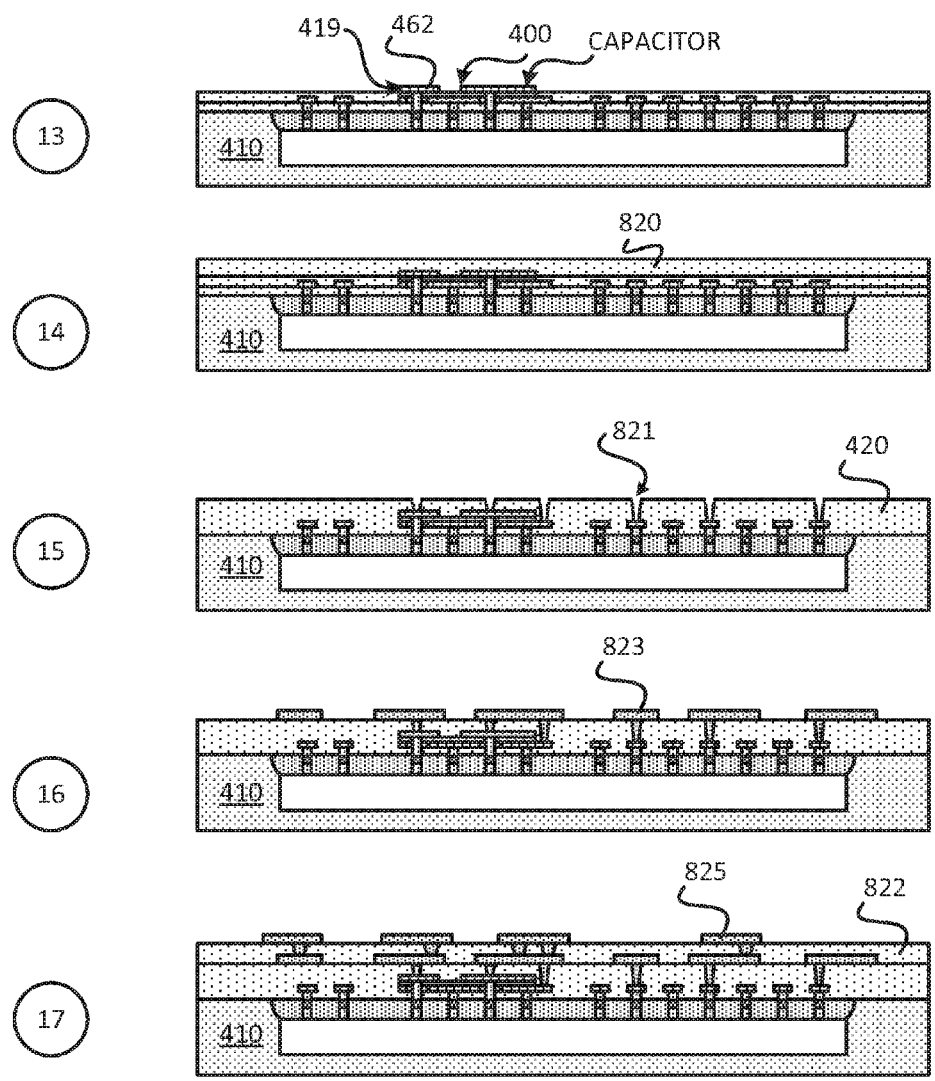

Stage 13 of FIG. 8C, illustrates a metal layer 819 formed in the plurality of cavities 817, over the insulation layer 464, and the dielectric layer 816. In some implementations, portions of the metal layer 819 may form the second plate 462 and pins (e.g., pin 482) of a capacitor. In some implementations, a capacitor (e.g., capacitor 400) may includes portions of the plurality of interconnects 813, the insulation layer 464 and portions of the metal layer 819 (e.g., second plate 462).

Stage 14 illustrates a dielectric layer 820 formed over the dielectric layer 816 and the metal layer 819. Different implementations may use different material for the dielectric layer 820.

Stage 15 illustrates a plurality of cavities 821 formed through the dielectric layer 420. In some implementations, the dielectric layer 420 includes the dielectric layer 812, the dielectric layer 814, the dielectric layer 816 and/or the dielectric layer 818. Different implementations may use different processes for forming the plurality of cavities 821. In some implementations, a laser process may be used to form the plurality of cavities 821.

Stage 16 illustrates a plurality of interconnects 823 formed in the plurality of cavities 821 and over the dielectric layer 420. In some implementations, a plating process may be used to form one or more metal layers (e.g., seed layer, metal layer) in the plurality of cavities 821 and over the dielectric layer 420.

Stage 17 illustrates a dielectric layer 822 and a plurality of interconnects 825 being formed over the dielectric layer 420 and the plurality of interconnects 823.

Figure 8D:
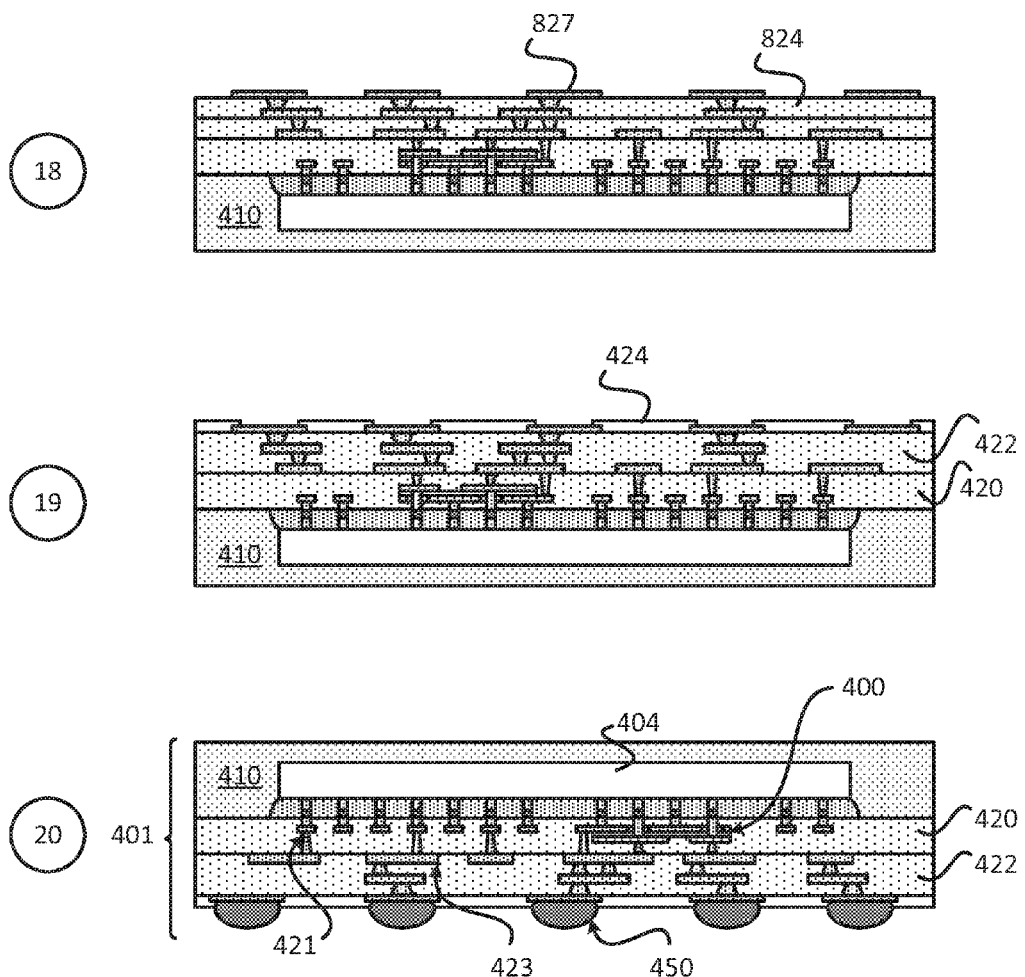

Stage 18 of FIG. 8D, illustrates a dielectric layer 824 and a plurality of interconnects 827 being formed over the dielectric layer 822 and the plurality of interconnects 825.

Stag 19 illustrates a solder resist layer 424 formed over the dielectric layer 422. The dielectric layer 422 may include the dielectric layer 822 and/or the dielectric layer 824.

Stage 20 illustrates a plurality of solder interconnects 450 formed over the plurality of interconnects 827. In some implementations, stage 20 may illustrate an integrated device 401 that includes a capacitor 400 that includes multiple pins. The integrated device 401 includes a die 404, an encapsulation layer 410, an underfill 412, a plurality of interconnects 430. The integrated device 401 (e.g., integrated device package) may also include at least one first dielectric layer 420, at least one second dielectric layer 422, and a solder resist layer 424. The capacitor 400 is located at least partially in the at least one first dielectric layer 420. The integrated device 401 may also include a plurality of first interconnects 421 in the at least one first dielectric layer 420; and a plurality of second interconnects 423 in the at least one second dielectric layer 422. The plurality of first interconnects 421 may include the plurality of interconnects 813 and/or 823. The plurality of second interconnects 423 may include the plurality of interconnects 823, 825 and/or 827.

Figure 9:
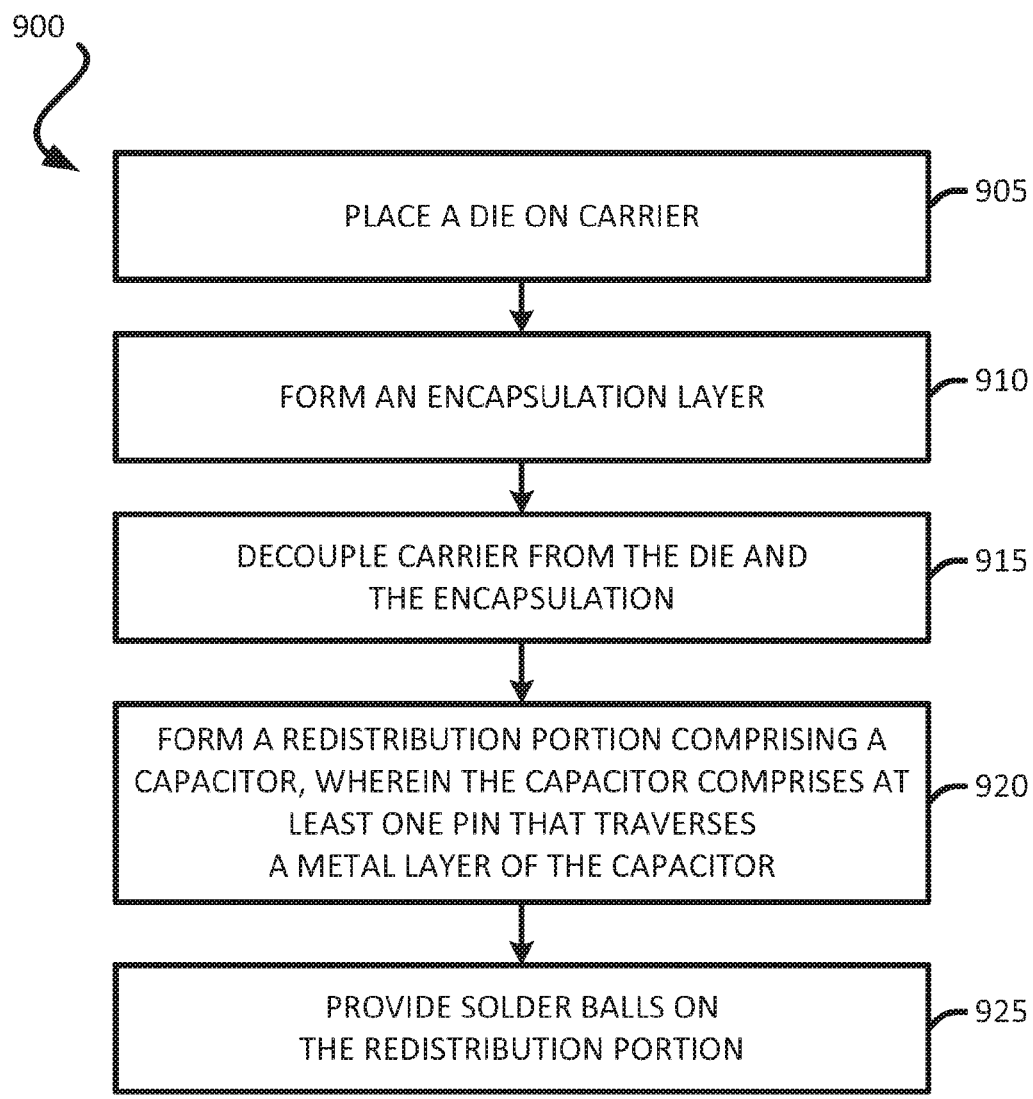
FIG. 9 illustrates an example of a flow diagram of a method for fabricating an integrated device that includes a capacitor that includes multiple pins and at least one pin that traverses a plate of the capacitor.

Exemplary Flow Diagram of a Method for Fabricating an Integrated Device Comprising a Capacitor In some implementations, providing/fabricating an integrated device that includes a capacitor with multiple pins includes several processes. FIG. 9 illustrates an exemplary flow diagram of a method 900 for providing/fabricating an integrated device (e.g., integrated device package) that includes a capacitor with multiple pins. In some implementations, the method 900 may be used to fabricate the integrated device that includes a capacitor with multiple pins of FIGS. 4-7 and/or other integrated devices described in the present disclosure.

It should be noted that the sequence of FIG. 9 may combine one or more processes in order to simplify and/or clarify the method for fabricating an integrated device. In some implementations, the order of the processes may be changed or modified.

The method places (at 905) a die on a carrier. For example, the method may place the die 404 over a carrier

800. The die 404 may include a plurality of interconnects 430, and the method places the die 404 comprising the plurality of interconnects 430 over the carrier 800.

The method forms (at 910) an encapsulation layer over the die and the carrier. For example, the method may form the encapsulation layer 410 over the die 404 and the carrier 800. In some implementations, the method may also form an underfill (e.g., underfill 412) between the die 404 and the carrier 800 prior to forming the encapsulation layer 410.

The method decouples (at 915) the carrier from the die and the encapsulation layer. For example, the method may remove (e.g., detach, grind) the carrier 800 from the die 404 and the encapsulation layer 410.

The method forms (at 920) a redistribution portion that includes a capacitor with multiple pins. In some implementations, the capacitor includes at least one pin that traverses through a plate of the capacitor. For example, the method may form a redistribution portion 402 that includes a dielectric layer 420 and the capacitor 400. In some implementations, a redistribution portion may include a capacitor with another design.

The method couples (at 925) a solder ball to the redistribution portion. For example, the method may provide and form a plurality of solder interconnects 450 over interconnects from the redistribution portion 402.

Exemplary Integrated Device Comprising a Capacitor that Includes Multiple Pins

Figure 10:
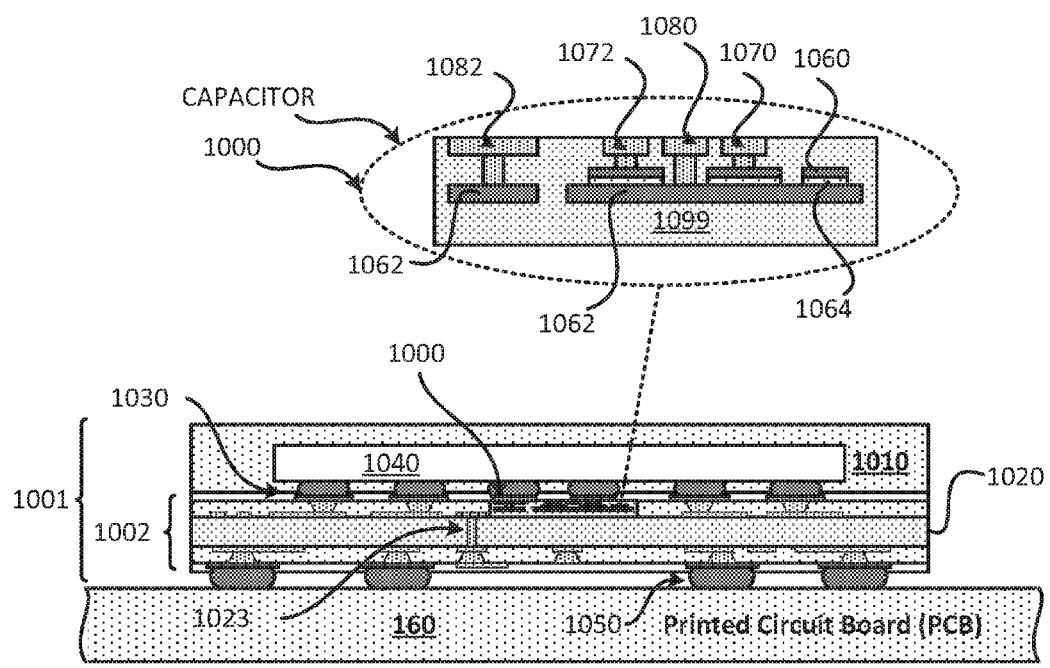
FIG. 10 illustrates an example of an integrated device that includes a capacitor that includes multiple pins and at least one pin that traverses a plate.

FIG. 10 illustrates an integrated device 1001 that includes a capacitor 1000 that includes multiple pins. The integrated device 1001 (e.g., integrated device package) includes a package substrate 1002, a die 1004, an encapsulation layer 1010, a plurality of interconnects 1030, and the capacitor 1000.

The package substrate 1002 is a laminate substrate that includes several dielectric layers 1020. The dielectric layers 1020 may include a core layer and a prepeg layer. The capacitor 1000 is a capacitor that is formed separately from the package substrate 1002 and then placed in the package substrate 1002 during a fabrication of the package substrate 1002. For example, the capacitor 1000 may be placed in a cavity of the package substrate 1002, and configured to be coupled to interconnects from the plurality of interconnects 1023 of the package substrate 1002. The capacitor 1000 may be configured to be coupled to interconnects from the plurality of interconnects 1030.

The capacitor 1000 includes a dielectric layer 1099, a first plate 1060, a second plate 1062, and an insulation layer 1064. A pin 1070 and a pin 1072 are coupled to the first plate 1060. A pin 1080 and a pin 1082 are coupled to the second plate 1062. A pin may include one or more interconnects (e.g., trace, via, pad). The first plate 1060, the second plate 1062, the insulation layer 1064, the pin 1070, the pin 1072, the pin 1080 and the pin 1082 are located within the dielectric layer 1099.

FIG. 10 illustrates one design of the capacitor 1000 that includes the first plate 1060, the second plate 1062 and the insulation layer 1064. However, the capacitor 1000 may include any of the capacitor designs described in the present disclosure.

Exemplary Sequence for Fabricating a Capacitor Comprising Multiple Pins

Figure 11A:
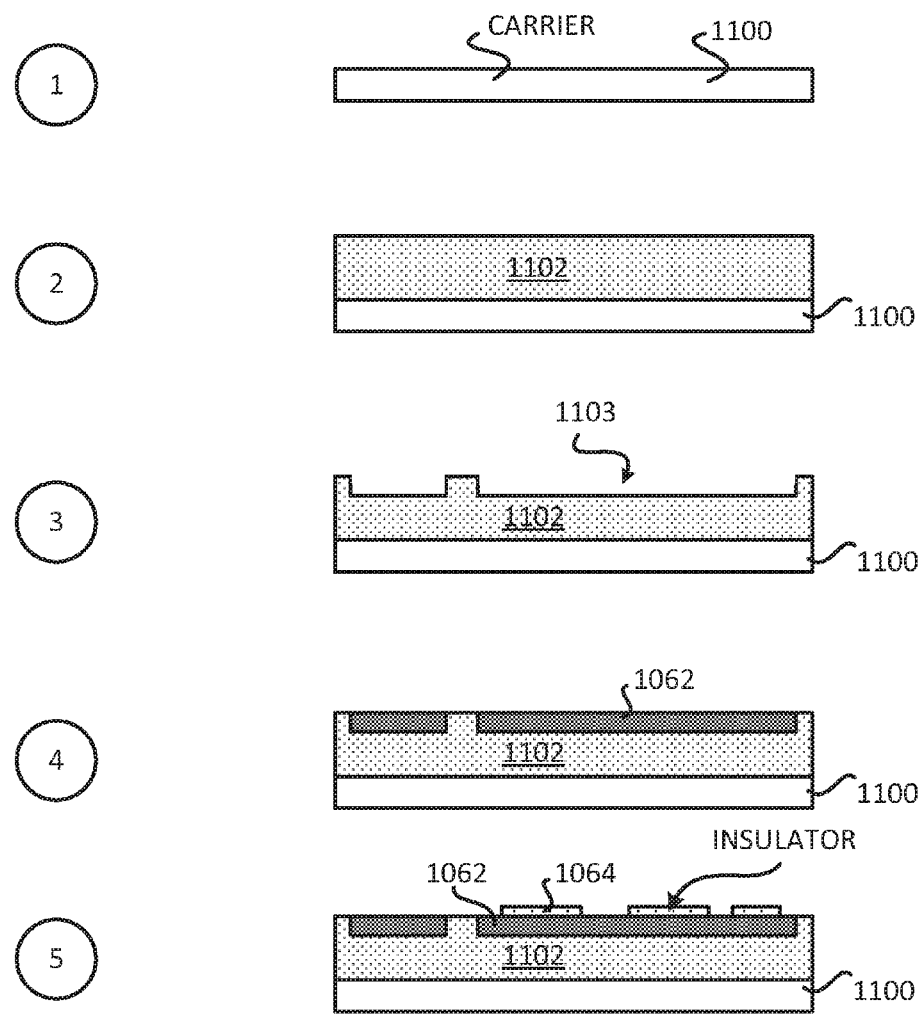
FIGS. 11A-11B illustrate an example of a sequence for fabricating a capacitor that includes multiple pins.
Figure 11B:
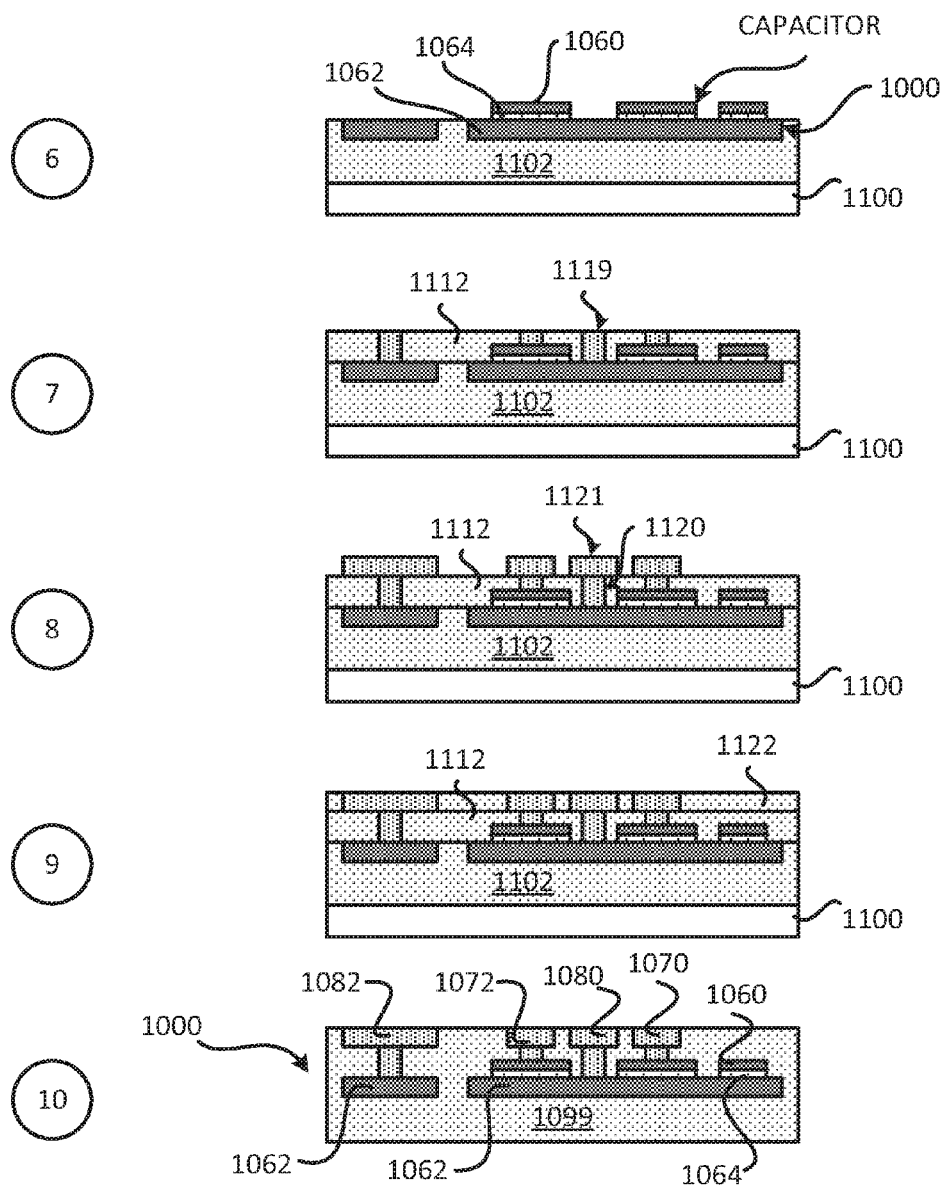

In some implementations, providing/fabricating a capacitor with multiple pins includes several processes. FIG. 11 (which includes FIGS. 11A-11B) illustrates an exemplary sequence for providing/fabricating a capacitor with multiple pins. In some implementations, the sequence of FIGS. 11A-11B may be used to fabricate the capacitor with multiple pins of FIG. 10 and/or other capacitors described in the present disclosure. FIGS. 11A-11B will be described in the context of providing/fabricating the capacitor of FIG. 10. In particular, FIGS. 11A-11B will be described in the context of fabricating the capacitor 1000 of FIG. 10.

It should be noted that the sequence of FIGS. 11A-11B may combine one or more stages in order to simplify and/or clarify the sequence for providing a capacitor with multiple pins. In some implementations, the order of the processes may be changed or modified.

Stage 1 of FIG. 11A, illustrates a carrier 1100 being provided. The carrier 1100 may be used as temporary base to fabricate an capacitor.

Stage 2 illustrates a dielectric layer 1102 formed over the carrier 1100.

Stage 3 illustrates a plurality of cavities 1103 formed in the dielectric layer 1102. In some implementations, a lithography process may be used to form (e.g., etch) the plurality of cavities 1103 in the dielectric layer 1102.

Stage 4 illustrates at least one metal layer (e.g., seed layer, metal layer) formed in the plurality of cavities 1103. The metal layer may form a second plate 1062 of a capacitor. In some implementations, a plating process may be used to form the at least one metal layer.

Stage 5 illustrates an insulation layer 1064 formed over the metal layer (e.g., second plate 1062). In some implementations, the insulation layer 1064 includes a material that has a k value of at least 7. However, different implementations may use a material with a different k value. In some implementation, the insulation layer 1064 has a thickness of about 50 nanometers (nm) or less.

Stage 6 of FIG. 11B, illustrates at least one metal layer (e.g., seed layer, metal layer) formed over the insulation layer 1064. The metal layer may form a first plate 1060 of a capacitor. In some implementations, a plating process may be used to form the at least one metal layer. A capacitor 1000 may be defined by the first plate 1060, the second plate 1062 and the insulation layer 1064. In some implementations, the MIM dielectrics and top metal layer (e.g., top plate) can be patterned in one step or stage.

Stage 7 illustrates a dielectric layer 1112 and at least one metal layer 1119 formed over the capacitor 1000. One or more metal layer 1119 may form a pin to and/or from the capacitor 1000. In some implementations, a plating process may be used to form the at least one metal layer.

Stage 8 illustrates at least one metal layer 1121 formed over the one or more metal layer 1119 and the dielectric layer 1112. One or more metal layer 1121 may form a pin to and/or from the capacitor 1000. In some implementations, a plating process may be used to form the at least one metal layer.

Stage 9 illustrates a dielectric layer 1122 formed over the one or more metal layer 1121 and the dielectric layer 1112.

Stage 10 illustrates the carrier 1110 decoupled (e.g., removed, grinded away) from the dielectric layer 1102. In some implementations, stage 10 illustrates the capacitor 1000 that includes a dielectric layer 1099, a first plate 1060, a second plate 1062, and an insulation layer 1064. A pin 1070 and a pin 1072 is coupled to the first plate 1060. A pin 1080 and a pin 1082 are coupled to the second plate 1062. A pin may include one or more interconnects (e.g., trace, via, pad). The first plate 1060, the second plate 1062, the insulation layer 1064, the pin 1070, the pin 1072, the pin 1080 and the pin 1082 are located within the dielectric layer 1099. The dielectric layer 1099 may include the dielectric layer 1102, the dielectric layer 1112, and/or the dielectric layer 1122.

Exemplary Integrated Device Comprising a Capacitor that Includes Multiple Pins

Figure 12:
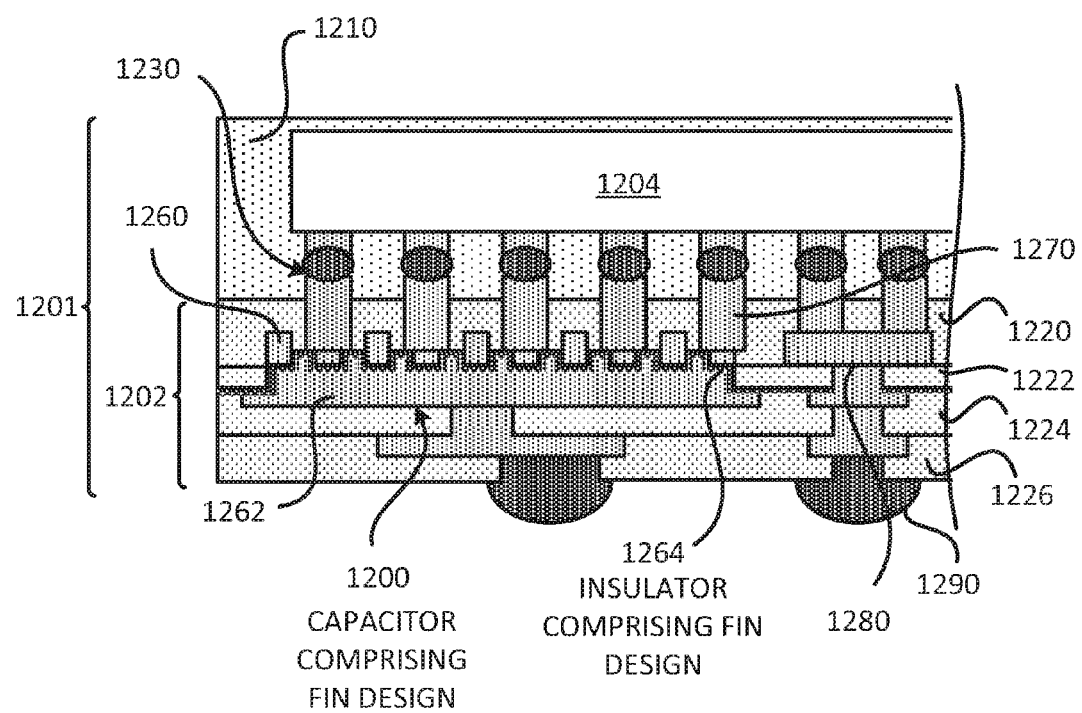
FIG. 12 illustrates a profile view of an integrated device that includes a capacitor that includes multiple pins.

FIG. 12 illustrates an integrated device 1201 that includes a capacitor 1200 that includes multiple pins. The capacitor 1200 includes a fin design (e.g., capacitor fin or trench design). The trench (fin) will increase the area for the capacitor 1200, which will increase the capacitance or capacitance capability of the capacitor 1200. The capacitor 1200 may be a means for capacitance. The integrated device 1201 (e.g., integrated device package) includes a redistribution portion 1202, a die 1204, an encapsulation layer 1210, and a plurality of interconnects 1230. The plurality of interconnects 1230 may include pillars and/or solder interconnects (e.g., solder balls).

The redistribution portion 1202 includes at least one dielectric layer (e.g., dielectric layer 1220, dielectric layer 1222, dielectric layer 1224, dielectric layer 1226) and the capacitor 1200. The capacitor 1200 is located at least partially in the at least one dielectric layer (e.g., dielectric layer 1220). A plurality of solder ball 1290 are coupled to the redistribution portion 1202.

The capacitor 1200 includes a first plate 1260, a second plate 1262 and an insulation layer 1264. The capacitor 1200 includes a fin design. The second plate 1262 includes a fin design or fin shape, such that the surface of the second plate 1262 traverses vertically and horizontally, in a repeated pattern, in the redistribution portion. The insulation layer 1264 substantially forms over a contour of the fin design of the second plate 1262. That is the insulation layer 1264 is formed such that the insulation layer 1264 substantially follows the contour of the surface of the fin design of the second plate 1262.

In some implementations, the fin design provides more surface area to form a capacitor, which allows for a capacitor with a higher capacitance, while minimizing the amount of space and/or real estate that the capacitor 1200 takes up in the integrated device 1201.

FIG. 12 illustrates that a pin 1270 (e.g., first pin) is coupled to the first plate 1260 (e.g., coupled to a first surface of the first plate 1260). A pin 1280 is coupled to the second plate 1262. In some implementations, the pin 1270 is configured to provide one or more electrical paths for a power signal (e.g., $V_{dd}$). In some implementations, the pin 1280 is configured to provide one or more electrical paths for a ground reference signal (e.g., $V_{ss}$). Different implementations may configure the pins to provide different electrical paths for different signals. It is noted that the capacitor fin design of FIG. 12 may be implemented in any of capacitors described in the present disclosure. In some implementations, a through trench capacitor connection may be made to provide multiple parallel access to the bottom plate electrode to the chips, the die, and/or the capacitor top plate access to a power source within an integrated device and/or an integrated device package.

Exemplary Sequence for Fabricating an Integrated Device Comprising a Capacitor

In some implementations, providing/fabricating an integrated device that includes a capacitor with multiple pins includes several processes. FIG. 13 (which includes FIGS. 13A-13D) illustrates an exemplary sequence for providing/fabricating an integrated device (e.g., integrated device package) that includes a capacitor with multiple pins. In some implementations, the sequence of FIGS. 13A-13D may be used to fabricate the integrated device that includes a capacitor with multiple pins of FIG. 12 and/or other integrated devices described in the present disclosure. FIGS. 13A-13D will be described in the context of providing/fabricating the integrated device of FIG. 12. In particular, FIGS. 13A-13D will be described in the context of fabricating the integrated device 1201 of FIG. 12.

It should be noted that the sequence of FIGS. 13A-13D may combine one or more stages in order to simplify and/or clarify the sequence for providing an integrated device. In some implementations, the order of the processes may be changed or modified.

Figure 13A:
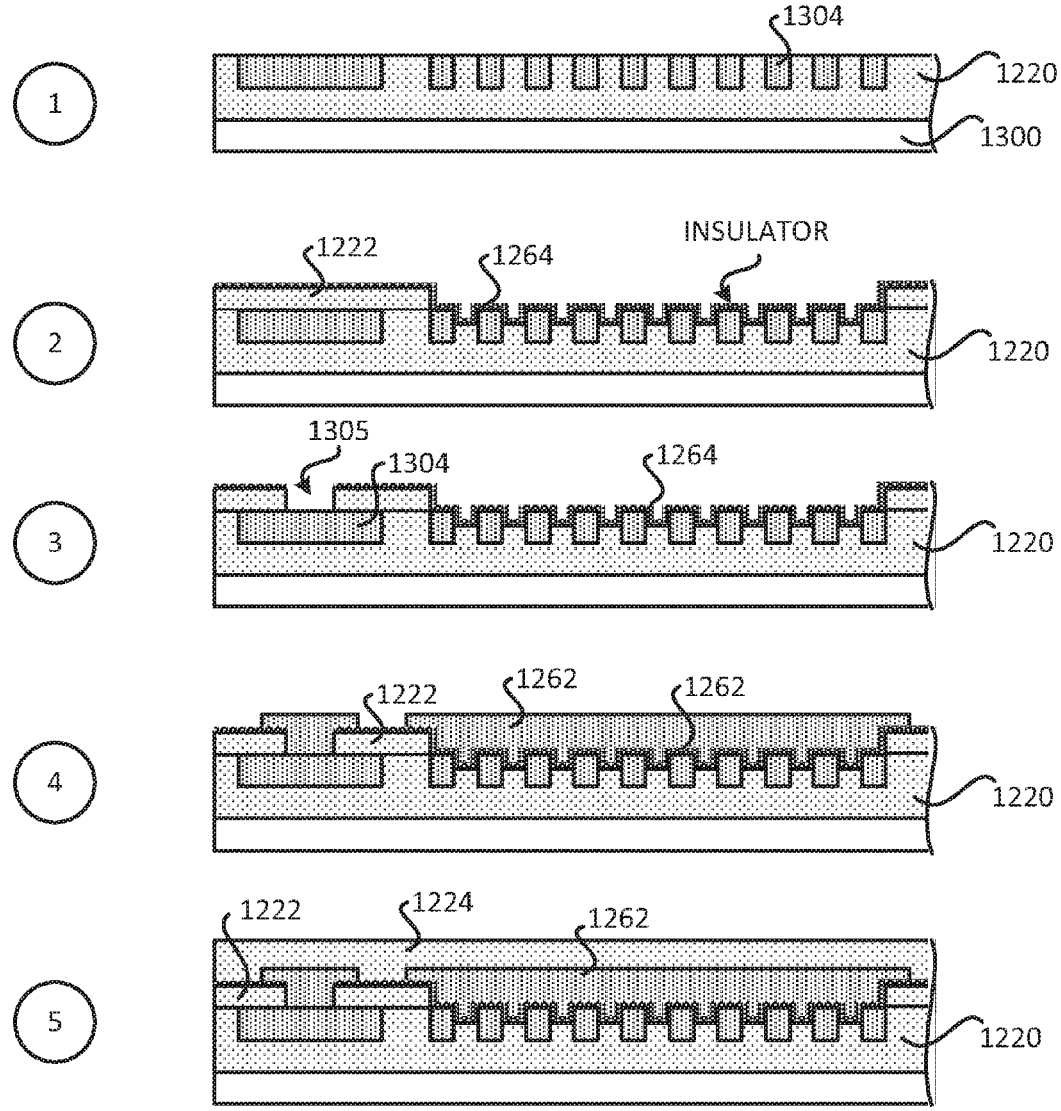
FIGS. 13A-13D illustrate an example of a sequence for fabricating an integrated device that includes a capacitor that includes multiple pins.

Stage 1 of FIG. 13A, illustrates a carrier 1300, a dielectric layer 1220, and a metal layer 1304. In some implementations, the dielectric layer 1220 is formed over the carrier 1300 and the metal layer 1304 is formed in the dielectric layer 1220, in a similar as described in FIG. 11A.

Stage 2 illustrates a dielectric layer 1222 formed over the dielectric layer 1220 and portions of the metal layer 1302. Stage 2 also illustrates an insulation layer 1264 formed over the dielectric layer 1220, the dielectric layer 1222 and portions of the metal layer 1304. In some implementations, portions of the metal layer 1304 may define a plate (e.g., first plate) of capacitor. In some implementations, the insulation layer 1264 includes a material that has a k value of at least 7. However, different implementations may use a material with a different k value. In some implementation, the insulation layer 1264 has a thickness of about 50 nanometers (nm) or less.

Stage 3 illustrates a plurality of cavities 1305 formed through the insulation layer 1264 and the dielectric layer 1222. In some implementations, a laser process and/or a lithography process may be used to form the plurality of cavities 1305.

Stage 4 illustrates a metal layer formed over the insulation layer 1264. The metal layer may be a second plate 1262 of a capacitor. The metal layer may include one or more metal layers (e.g., seed layer, metal layer). A plating process may be used to form the metal layer that defines the second plate 1262.

Stage 5 illustrates a dielectric layer 1224 formed over the second plate 1262 and the dielectric layer 1222.

Figure 13B:
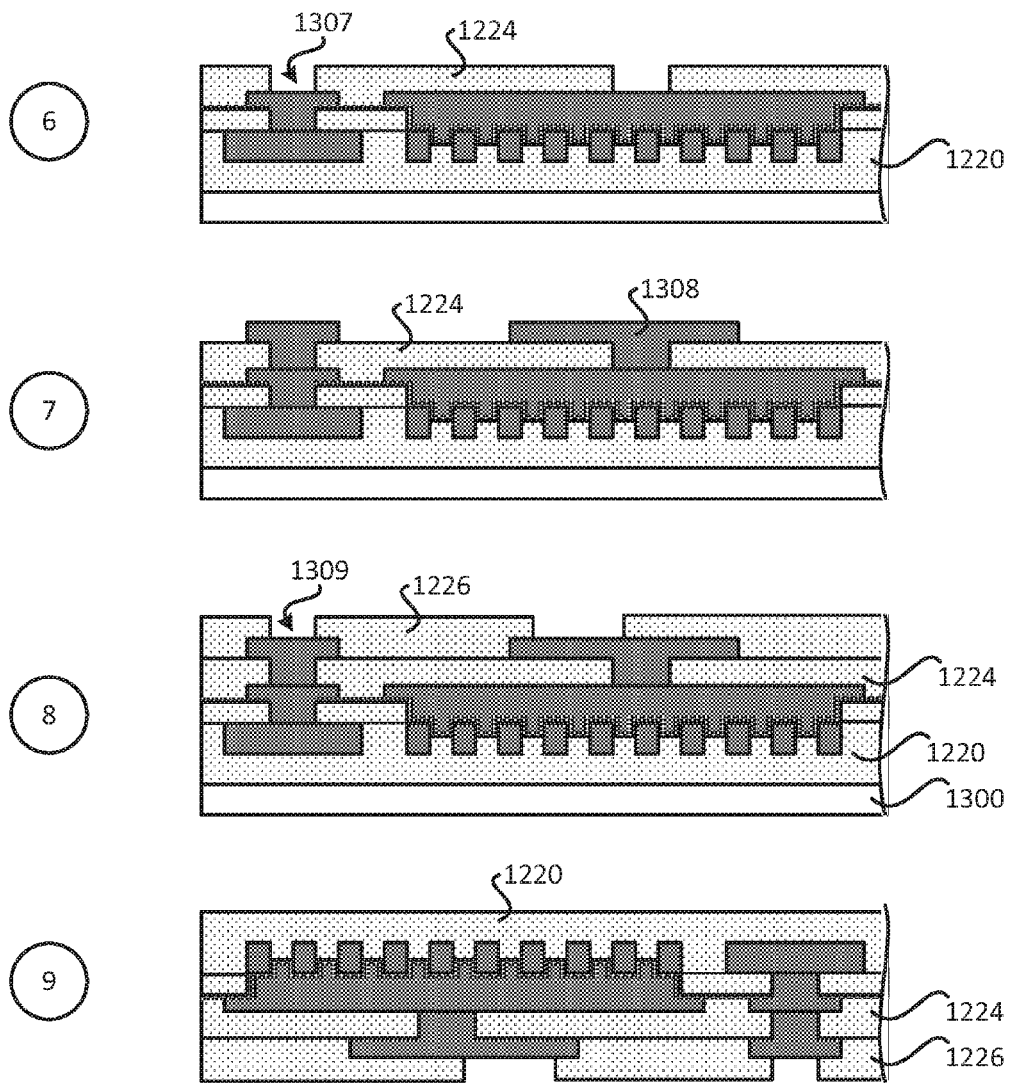

Stage 6 of FIG. 13B, illustrates a plurality of cavities 1307 formed in the dielectric layer 1224. In some implementations, a laser process and/or a lithography process may be used to form the plurality of cavities 1307.

Stage 7 illustrates a metal layer 1308 in the plurality of cavities 1307 and over the dielectric layer 1224. A plating process may be used to form the metal layer 1308. The metal layer 1308 may include one or more metal layers (e.g., seed layer, metal layer). The metal layer 1308 may form a plurality of interconnects (e.g., traces, pads, vias).

Stage 8 illustrates a dielectric layer 1226 formed over the dielectric layer 1224 and the metal layer 1308. A plurality of cavities 1309 is formed in the dielectric layer 1226.

Stage 9 illustrates the carrier 1300 decoupled (e.g., removed, grinded away) from the dielectric layer 1220.

Figure 13C:
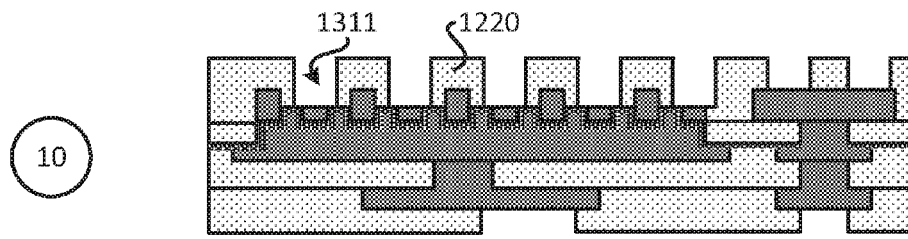
Figure 13C:
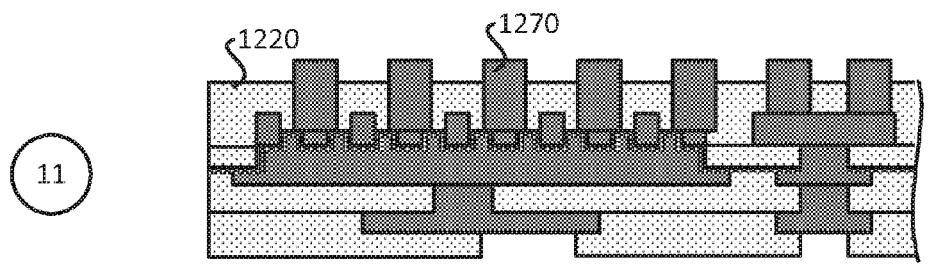
Figure 13C:
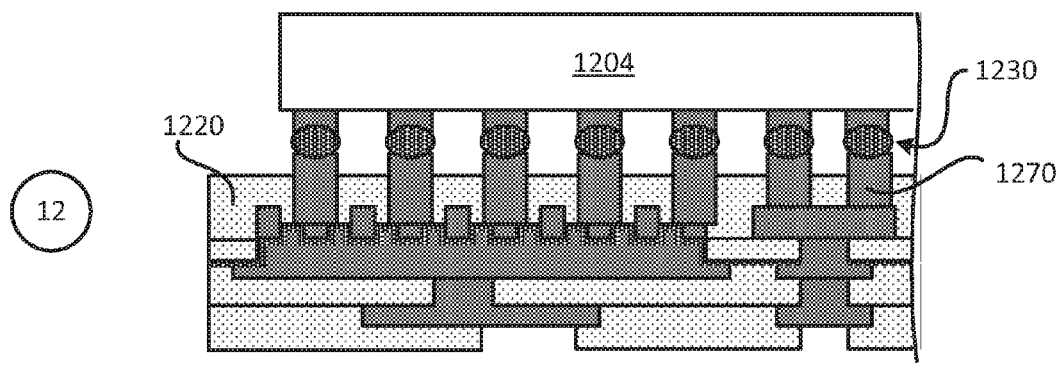

Stage 10 of FIG. 13C, illustrates a plurality of cavities 1311 formed in the dielectric layer 1220. In some implementations, a laser process and/or a lithography process may be used to form the plurality of cavities 1311.

Stage 11 illustrates a metal layer in the plurality of cavities 1311 and over the dielectric layer 1220. The metal layer may form one or more pins 1270 coupled to a capacitor. A plating process may be used to form the metal layer that forms one or more pins 1270. The metal layer may include one or more metal layers (e.g., seed layer, metal layer).

Stage 12 illustrates a die 1204 coupled to the pins 1270 through a plurality of interconnects 1230. The plurality of interconnects 1230 may include pillars and/or solder interconnects (e.g., solder balls).

Figure 13D:
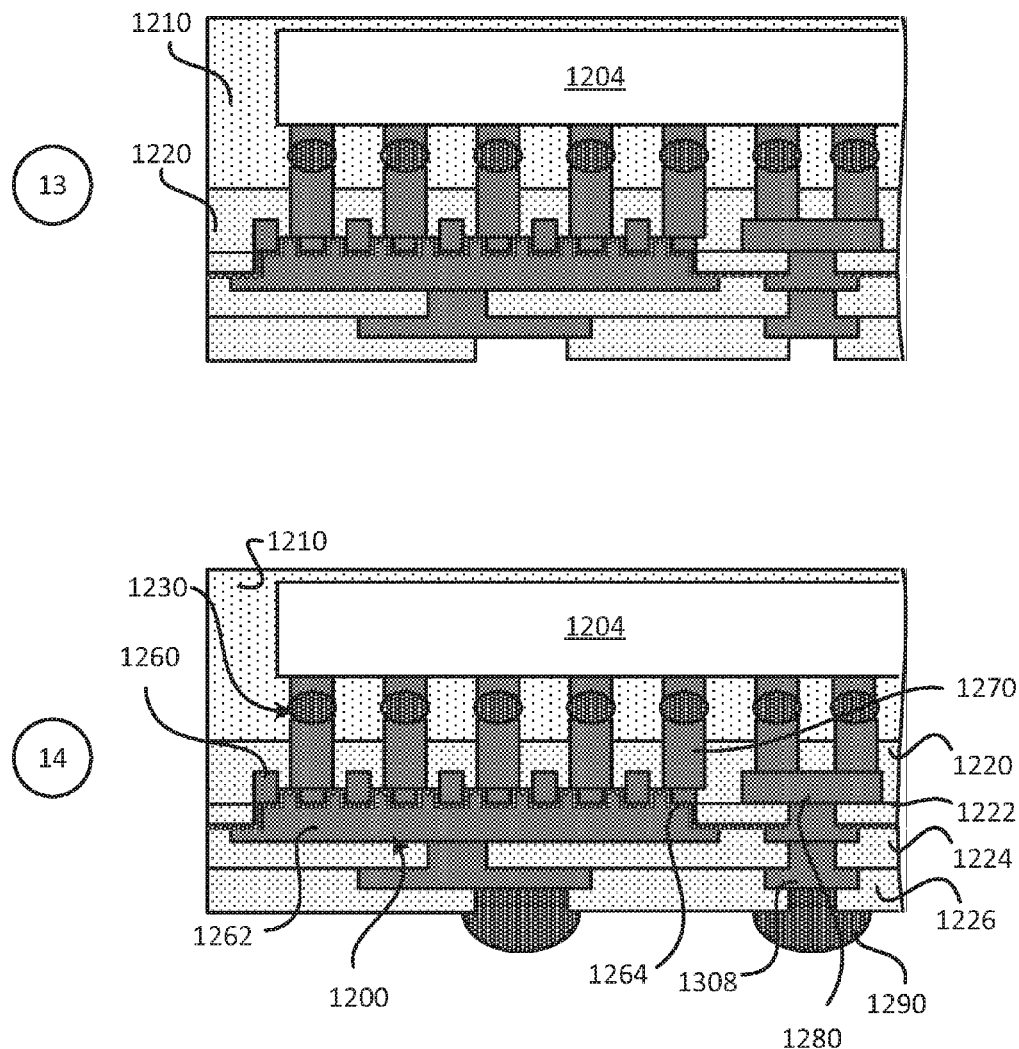

Stage 13 of FIG. 13D, illustrates an encapsulation layer 1210 formed over the die 1204 and the dielectric layer 1220. The encapsulation layer 1210 may at least partially encapsulate the die 1204 and the plurality of interconnects 1230.

Stage 14 illustrates a plurality of solder ball 1290 coupled to the metal layer 1308. The metal layer 1308 may form a plurality of interconnects (e.g., traces, pads, vias).

Exemplary Electronic Devices

Figure 14:
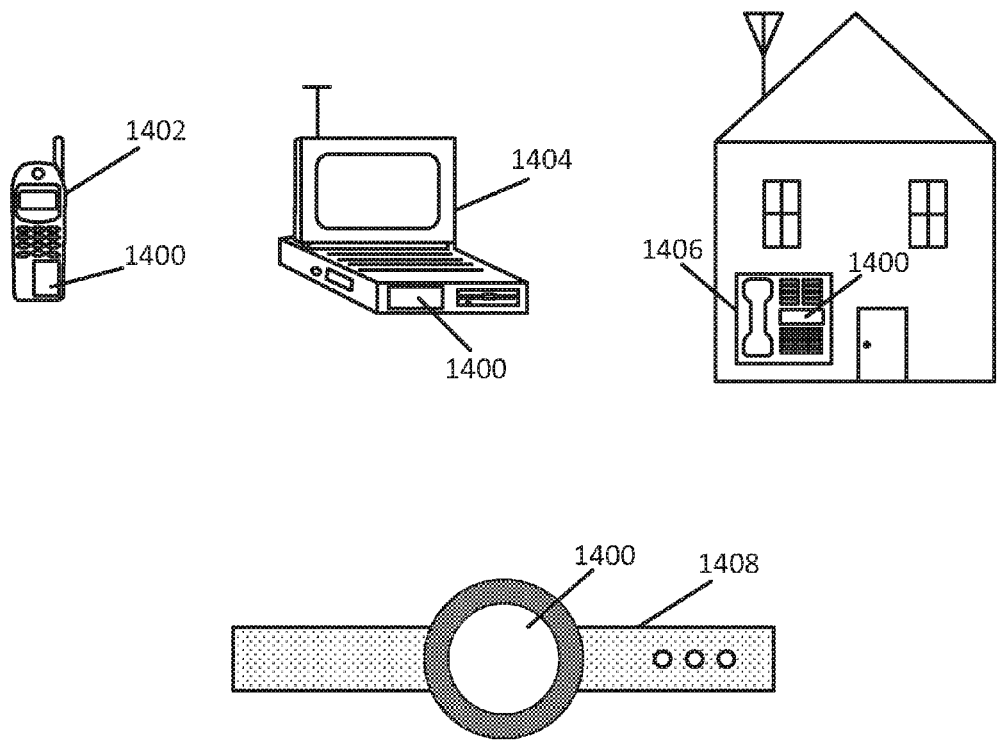
FIG. 14 illustrates various electronic devices that may integrate an integrated device, an integrated device package, a semiconductor device, a die, an integrated circuit, a substrate, an interposer, a package-on-package device, and/or PCB described herein.

FIG. 14 illustrates various electronic devices that may be integrated with any of the aforementioned integrated device, semiconductor device, integrated circuit, die, interposer, package or package-on-package (PoP). For example, a mobile phone device 1402, a laptop computer device 1404, a fixed location terminal device 1406, a wearable device 1408 may include an integrated device 1400 as described herein. The integrated device 1400 may be, for example, any of the integrated circuits, dies, integrated devices, integrated device packages, integrated circuit devices, device packages, integrated circuit (IC) packages, package-on-package devices described herein. The devices 1402, 1404, 1406, 1408 illustrated in FIG. 14 are merely exemplary. Other electronic devices may also feature the integrated device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof One or more of the components, processes, features, and/or functions illustrated in FIGS. 2, 3, 4, 5, 6, 7, 8A-8D, 9, 10, 11A-11B, 12, 13A-13D and/or 14 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6, 7, 8A-8D, 9, 10, 11A-11B, 12, 13A-13D and/or 14 and its corresponding description in the present disclosure is not limited to dies and/or ICs. In some implementations, FIGS. 2, 3, 4, 5, 6, 7, 8A-8D, 9, 10, 11A-11B, 12, 13A-13D and/or 14 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a die; and
   a first redistribution portion coupled to the die, wherein the first redistribution portion comprises:
   at least one dielectric layer;
   a capacitor comprising:
     a first plate;
     a second plate;
     an insulation layer located between the first plate and the second plate;
   a plurality of first pins coupled to the first plate of the capacitor; and
   a plurality of second pins coupled to the second plate of the capacitor,
   wherein at least one pin from the plurality of first pins traverses through the second plate to couple to the first plate of the capacitor.

2. The integrated device of claim 1, wherein at least one pin from the plurality of first pins comprises at least one interconnect.

3. The integrated device of claim 2, wherein the at least one interconnect comprises a via, a trace, and/or a pad.

4. The integrated device of claim 1, wherein the second plate comprises a fin design.

5. The integrated device of claim 4, wherein the insulation layer substantially forms over a contour of the fin design of the second plate.

6. The integrated device of claim 1, wherein the first redistribution portion further comprises at least one input/output (I/O) pin that traverses through the first plate and the second plate of the capacitor.

7. The integrated device of claim 1, wherein the insulation layer comprises a k value of at least 7.

8. The integrated device of claim 1, further comprising a second redistribution portion, wherein the first redistribution portion comprises a plurality of first interconnects having a first spacing, and wherein the second redistribution portion comprises a plurality of second interconnects having a second spacing that is different than the first spacing.

9. The integrated device of claim 1, wherein the integrated device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in a automotive vehicle.

10. The integrated device of claim 1, wherein a portion of the at least one dielectric layer surrounds a portion of the at least one pin where the at least one pin traverses through the second plate.

11. The integrated device of claim 1, wherein the first redistribution portion further comprises at least one second dielectric layer and the capacitor is at least partially located in the at least one dielectric layer and the at least one second dielectric layer.

12. An apparatus comprising:
- a die; and
- a first redistribution portion coupled to the die, wherein the first redistribution portion comprises:
  - at least one dielectric layer;
  - a means for capacitance located in the at least one dielectric layer;
  - a plurality of first pins coupled to a first portion of the means for capacitance; and
  - a plurality of second pins coupled to a second portion of the means for capacitance;
  - wherein at least one pin from the plurality of first pins at least partially traverses through the second portion of the means for capacitance.

13. The apparatus of claim 12, wherein at least one pin from the plurality of first pins comprises at least one interconnect.

14. The apparatus of claim 13, wherein the at least one interconnect comprises a via, a trace, and/or a pad.

15. The apparatus of claim 12, wherein the means for capacitance comprises a fin design.

16. The apparatus of claim 15, wherein the means for capacitance comprises an insulation layer that substantially forms over a contour of the fin design.

17. The apparatus of claim 12, wherein the first redistribution portion further comprises at least one input/output (I/O) pin that traverses through the means for capacitance.

18. The apparatus of claim 12, wherein the means for capacitance includes an insulation layer comprises a k value of at least 7.

19. The apparatus of claim 12, further comprising a second redistribution portion, wherein the first redistribution portion comprises a plurality of first interconnects having a first spacing, and wherein the second redistribution portion comprises a plurality of second interconnects having a second spacing that is different than the first spacing.

20. The apparatus of claim 12, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in a automotive vehicle.

21. The apparatus of claim 12, wherein a portion of the at least one dielectric layer surrounds a portion of the at least one pin where the at least one pin traverses through the second portion of the means for capacitance.

22. The apparatus of claim 12, wherein the first redistribution portion further comprises t least one second dielectric layer and the means for capacitance is at least partially located in the at least one dielectric layer and the at least one second dielectric layer.

* * * * *